US009627084B2

(12) United States Patent
Kwak et al.

(10) Patent No.: US 9,627,084 B2
(45) Date of Patent: Apr. 18, 2017

(54) STORAGE DEVICE INCLUDING NONVOLATILE MEMORY DEVICE AND CONTROLLER

(71) Applicant: SAMSUNG ELECTRONICS CO., LTD., Suwon-Si, Gyeonggi-Do (KR)

(72) Inventors: Donghun Kwak, Hwaseong-Si (KR); Myoung-Won Yoon, Suwon-Si (KR); Daeseok Byeon, Seongnam-Si (KR); Chiweon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/085,498

(22) Filed: Mar. 30, 2016

(65) Prior Publication Data

US 2017/0004886 A1 Jan. 5, 2017

(30) Foreign Application Priority Data

Jun. 30, 2015 (KR) ........................ 10-2015-0093055

(51) Int. Cl.
| | |
|---|---|
| *G11C 16/10* | (2006.01) |
| *G11C 16/34* | (2006.01) |
| *G11C 16/16* | (2006.01) |
| *G11C 16/26* | (2006.01) |
| *G11C 16/04* | (2006.01) |

(52) U.S. Cl.
CPC ...... *G11C 16/3404* (2013.01); *G11C 16/0483* (2013.01); *G11C 16/10* (2013.01); *G11C 16/16* (2013.01); *G11C 16/26* (2013.01); *G11C 16/349* (2013.01); *G11C 16/3459* (2013.01)

(58) Field of Classification Search
CPC ................................ G11C 16/10; G11C 16/26
USPC ........................................ 365/185.11, 185.24
See application file for complete search history.

(56) References Cited

U.S. PATENT DOCUMENTS

| | | | |
|---|---|---|---|
| 7,679,133 B2 | 3/2010 | Son et al. | |
| 8,243,518 B2 | 8/2012 | Oh et al. | |
| 8,295,091 B2 | 10/2012 | Itagaki et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,861,282 B2 | 10/2014 | Dutta et al. | |
| 8,867,271 B2 | 10/2014 | Li et al. | |
| 8,902,651 B2* | 12/2014 | Kwak ................. H01L 27/1157 | |
| | | | 365/185.03 |
| 8,913,432 B2 | 12/2014 | Dong et al. | |
| 8,917,552 B2 | 12/2014 | Maeda | |
| 8,942,042 B2 | 1/2015 | Lee et al. | |
| 8,995,192 B2 | 3/2015 | Khouri et al. | |
| 9,036,419 B2 | 5/2015 | Park et al. | |

(Continued)

*Primary Examiner* — Michael Tran
(74) *Attorney, Agent, or Firm* — Volentine & Whitt, PLLC

(57) ABSTRACT

A storage device includes a nonvolatile memory device including memory blocks and a controller configured to control the nonvolatile memory device. Each of the memory blocks includes a plurality of cell strings each including at least one selection transistor and a plurality of memory cells stacked on a substrate in a direction perpendicular to the substrate. The controller controls the nonvolatile memory device to perform a read operation on some of selection transistors of a selected one of the memory blocks and to perform a program operation on the selection transistors of the selected memory block according to a result of the read operation.

20 Claims, 16 Drawing Sheets

(56) References Cited

U.S. PATENT DOCUMENTS

| | | |
|---|---|---|
| 2011/0222346 A1 | 9/2011 | Honda |
| 2011/0233648 A1 | 9/2011 | Seol et al. |
| 2013/0094294 A1* | 4/2013 | Kwak ................ H01L 27/1157 365/185.03 |
| 2014/0043901 A1* | 2/2014 | Kwak .................... G11C 16/10 365/185.03 |
| 2014/0085989 A1 | 3/2014 | Fukuzumi |
| 2015/0043283 A1* | 2/2015 | Kwak ................ H01L 27/1157 365/185.22 |
| 2015/0179235 A1* | 6/2015 | Nam ...................... G11C 16/16 365/218 |
| 2015/0262682 A1* | 9/2015 | Futatsuyama .......... G11C 16/10 365/185.22 |

\* cited by examiner

FIG. 2
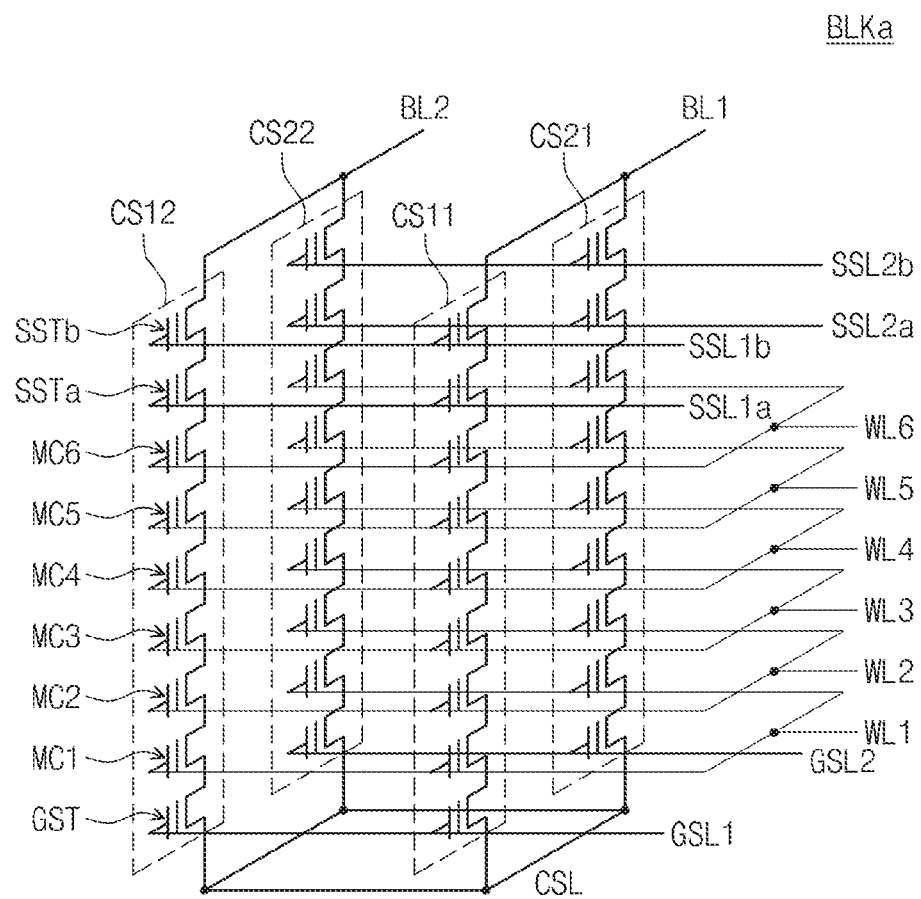
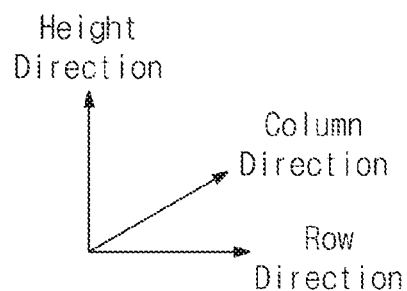

FIG. 4

| Scheme | Description |
|---|---|
| S1 | Select at least one plane predetermined |
| S2 | Select at least one plane according to a pattern |
| S3 | Select at least one plane randomly |

FIG. 6

| | |
|---|---|
| BL1 and BL2 | VBL1 |
| Selection line of selected plane among SSL1b and SSL2b | VREAD1 |
| Selection line of unselected plane among SSL1b and SSL2b | VOFF1 |
| Selected selection line among SSL1a and SSL2a | VRD1 |
| Unselected selection line among SSL1a and SSL2a | VREAD2 |
| WL1 ~ WL6 | VREAD3 |
| Selection line of selected plane among GSL1 and GSL2 | VREAD4 |
| Selection line of unselected plane among GSL1 and GSL2 | VOFF2 |

FIG. 8

| Scheme | Description |
|---|---|
| S4 | V1 is fixed value |
| S5 | V1 is selected among a plurality of values according to number of erases |
| S6 | Generate random value based on fixed average value |
| S7 | Generate random value based on average value selected among a plurality of average values according to number of erases |
| S8 | Generate random value within fixed range |
| S9 | Generate random value within range selected among a plurality of ranges according to number of erases |
| S10 | Generate random value |

FIG. 11

| | |
|---|---|
| Selected bit line corresponding to on cell among BL1 and BL2 | VBL2 |
| Unselected bit line corresponding to off cell among BL1 and BL2 | VBL3 |
| SSL1b and SSL2b | VPASS1 |
| Selected selection line among SSL1a and SSL2a | VPGM |
| Unselected selection line among SSL1a and SSL2a | VSSL |
| WL1 ~ WL6 | VPASS2 |
| GSL1 and GSL2 | VOFF3 |

FIG. 13
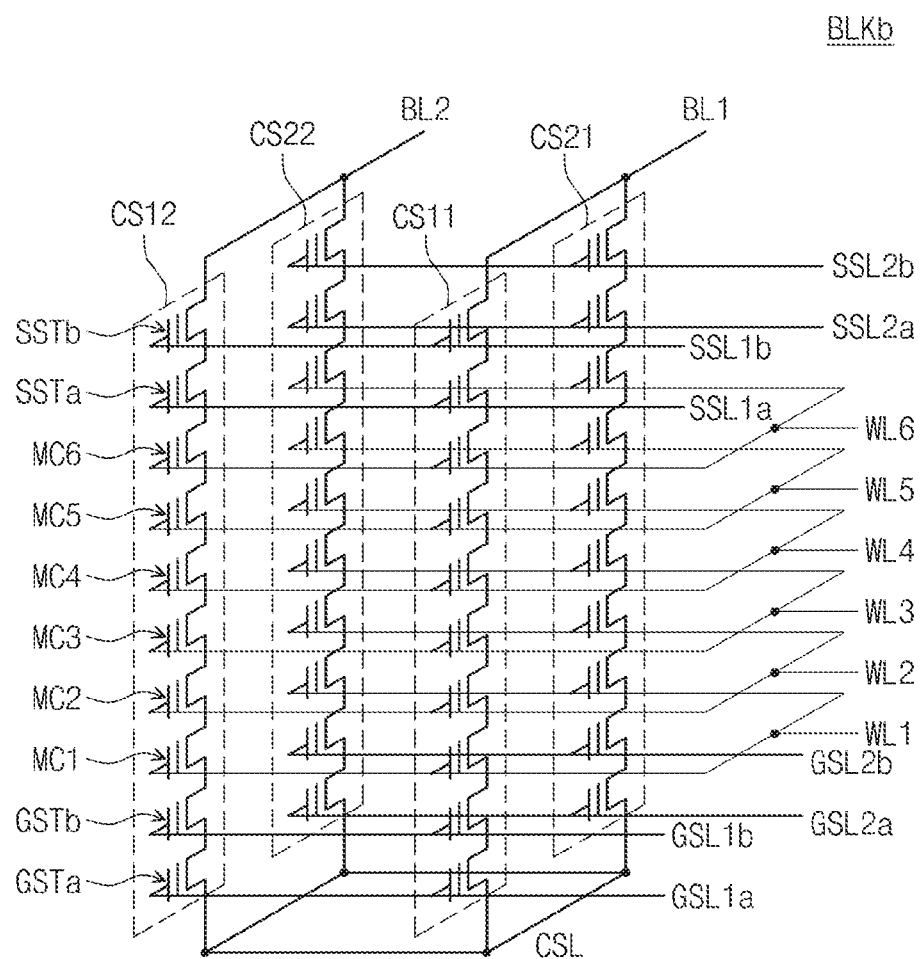
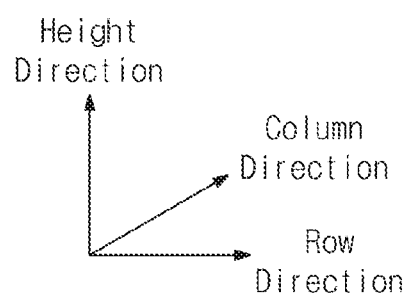

STORAGE DEVICE INCLUDING NONVOLATILE MEMORY DEVICE AND CONTROLLER

CROSS-REFERENCE TO RELATED APPLICATIONS

A claims of priority under 35 USC §119 is made to Korean Patent Application No. 10-2015-0093055, filed on Jun. 30, 2015, the entirety of which is hereby incorporated by reference.

BACKGROUND

The present disclosure relates to semiconductor circuits, and more particularly, to storage devices which include a nonvolatile memory device and a controller.

A storage device is a device that stores data under control of a host device. A few examples of a host device include a computer, a smartphone, and a smart pad or tablet. In generally, one class of storage devices stores data on a magnetic (or optical) disk such as a hard disk drive (HDD), while another class of storage devices stores data on a semiconductor memory such as a solid state drive (SSD) or a memory card.

Nonvolatile semiconductor memory devices retain stored data in absence of supplied power, and examples thereof include read-only memory (ROM), a programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like.

As semiconductor manufacturing technologies continue to advance, storage devices of increased integration and higher memory capacity are realized. However, the resultant reductions in scale and changes in structures present significant challenges in avoiding degradations in reliability of storage devices.

SUMMARY

A storage device according to example embodiments of inventive concepts includes a nonvolatile memory device including memory blocks and a controller configured to control the nonvolatile memory device. Each of the memory blocks may include a plurality of cell strings each including at least one selection transistor and a plurality of memory cells stacked on a substrate in a direction perpendicular to the substrate. The controller may control the nonvolatile memory device to perform a read operation on some of selection transistors of a selected one of the memory blocks, and to perform a program operation on the selection transistors of the selected memory block according to a result of the read operation.

A storage device according to example embodiments includes a nonvolatile memory device including memory blocks and a controller configured to control the nonvolatile memory device. Each of the memory blocks may include a plurality of cell strings each including at least one selection transistor and a plurality of memory cells stacked on a substrate in a direction perpendicular to the substrate. The controller may be configured to perform a read operation on at least some of selection transistors of the selected memory block when an erase count of a selected one of the memory block reaches a critical value. The controller may be configured to increase the critical value by a randomly generated value when the read operation is performed on at least some of the selected transistors of the selected memory block.

A storage device according to example embodiments includes a nonvolatile memory device including memory blocks, and a controller configured to control the nonvolatile memory device. Each of the memory blocks may include a plurality of cell strings each including at least one selection transistor and a plurality of memory cells stacked on a substrate in a direction perpendicular to the substrate. The controller may monitor respective threshold voltages of at least some of the selection transistors of a selected one of the memory blocks, and may carry out a recovery operation on the selection transistors of the selected memory block according to a result of the monitoring of the threshold voltages.

BRIEF DESCRIPTION OF THE DRAWINGS

The forgoing and other features of inventive concepts will be described below in more detail with reference to the accompanying drawings of non-limiting embodiments of inventive concepts in which like reference characters refer to like parts throughout the different views. The drawings are not necessarily to scale, emphasis instead being placed upon illustrating principles of inventive concepts. In the drawings:

FIG. 2 is a circuit diagram of a memory block according to example embodiments of inventive concepts;

FIG. 4 is a table for reference in describing example methods of selecting some of string selection transistors using a selection transistor manager by a controller;

FIG. 6 is a table for reference in describing an example of a method for performing a read operation of some of string selection transistors according to example embodiments of inventive concepts;

FIG. 8 is a table for reference in describing example methods of deciding a first value added to a second critical value;

FIG. 11 is a table for reference in describing embodiments in which string selection transistors are programmed;

FIG. 13 is a circuit diagram of a memory block according to example embodiments of inventive concepts;

DETAILED DESCRIPTION

Figure 1:
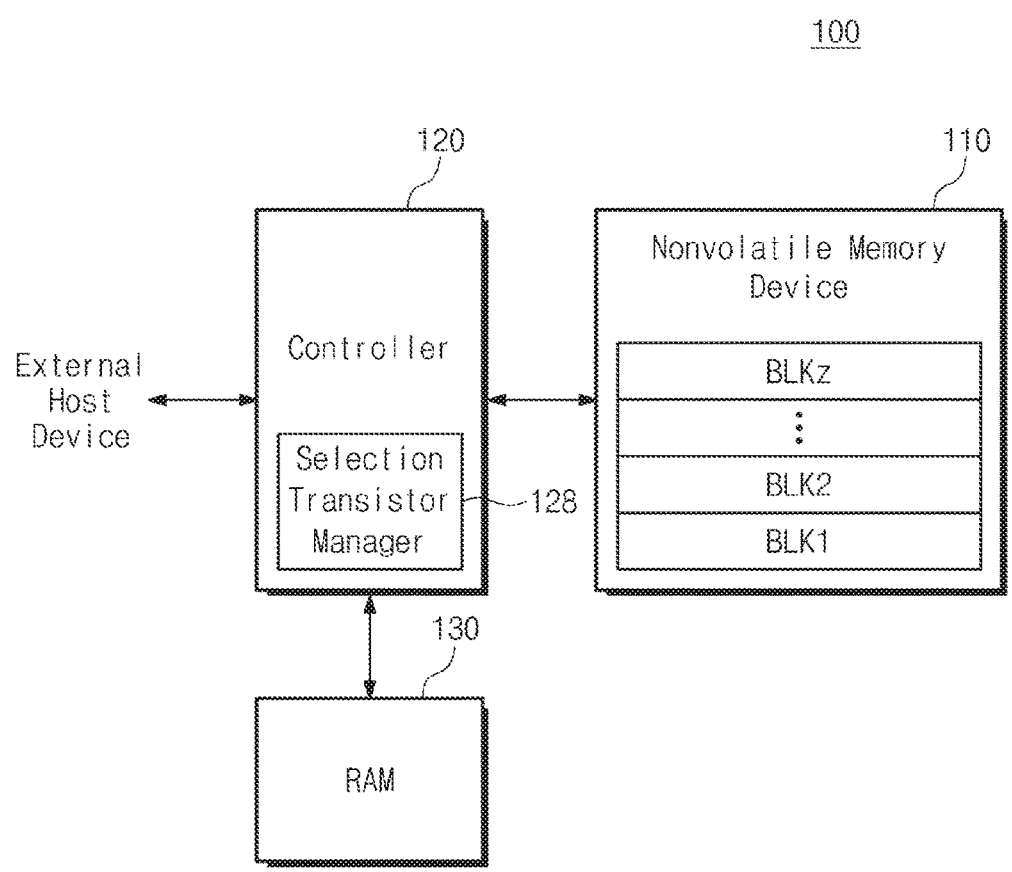
FIG. 1 is a block diagram of a storage device according to example embodiments of inventive concepts.

FIG. 1 is a block diagram of a storage device 100 according to example embodiments of inventive concepts. As illustrated, the storage device 100 includes a nonvolatile memory 110, a memory controller 120, and a random access memory (RAM) 130.

The nonvolatile memory device 110 includes a plurality of memory blocks BLK1 to BLKz. Each of the memory blocks BLK1 to BLKz includes a plurality of memory cells. The nonvolatile memory device 110 may perform write, read, and erase operations on the plurality of memory cells under control of the controller 120.

The controller 120 is configured to communicate with an external host device. The controller 120 may control the nonvolatile memory device 110 according to a request of the external host device. The controller 120 may use the RAM 130 as a working memory, a cache memory or a buffer memory.

The controller 120 includes a selection transistor manager 128. The selection transistor manager 128 may monitor whether the selection transistors included in each of the memory blocks BLK1 to BLKz are degraded. For example, the selection transistor manager 128 may monitor a change in threshold voltages of the selection transistors. In addition, the selection transistor manager 128 may perform recovery of the degraded selection transistors. For example, the selection transistor manager 128 may perform a program operation on the degraded selection transistors.

FIG. 2 is a circuit diagram of a memory block BLKa according to example embodiments of inventive concepts. As illustrated, the memory block BLKa includes a plurality of cell strings CS11 to CS21 and CS12 to CS22. The cell strings CS11 to CS21 and CS12 to CS22 may be arranged in a row direction and a column direction to form rows and columns.

For example, the cell strings CS11 and CS12 arranged in the row direction may form a first row, and the cell strings CS21 and CS22 arranged in the row direction may form a second row. The cell strings CS11 and CS21 arranged in the column direction may form a first column, and the cell strings CS12 and CS22 arranged in the column direction may form a second column.

Each cell string may include a plurality of cell transistors. The cell transistors include ground selection transistors GSTa and GSTb, memory cells MC1 to MC6, and string selection transistors SSTa and SSTb. The ground selection transistors GST, the memory cells MC1 to MC6, and the string selection transistors SSTa and SSTb of each cell string may be stacked in a direction perpendicular to a plane on which the cell strings CS11 to CS21 and CS12 to CS22 are arranged in a matrix of rows and columns (e.g., a plane on a substrate of the memory block BLKb). This perpendicular direction is referred to as a height direction in FIG. 2.

The plurality of cell transistors may be charge trap type transistors having threshold voltages that vary depending on the amount of charged trapped to an insulating layer.

Lowermost ground selection transistors GSTa may be commonly connected to a common source line CSL.

Control gates of ground selection transistors GST of the cell strings CS11 to CS21 and CS12 to CS22 may be connected to ground selection lines GS1 and GSL2, respectively. In example embodiments, ground selection transistors of the same row may be connected to the same ground selection line and ground selection transistors of different rows may be connected to different ground selection lines. For example, ground selection transistors GST of the cell strings CS11 and CS12 of a first row may be connected to a first ground selection line GSL1 and ground selection transistors GST of the cell strings CS21 and CS22 of a second row may be connected to a second ground selection line GSL2.

Memory cells at the same height from a substrate (or, ground selection transistors GST) may be commonly connected to a same wordline, and memory cells at different heights (or order) may connected to different wordlines WL1 to WL6. For example, memory cells MC1 are connected in common to a wordline WL1, and memory cells MC2 are commonly connected to a wordline WL2. Memory cells MC3 are commonly connected to a wordline WL3. Memory cells MC4 are commonly connected to a wordline WL4. Memory cells MC5 are commonly connected to a wordline WL5. Memory cells MC6 are commonly connected to a wordline WL6.

First string selection transistors SSTa are of the same height (or order) in the cell strings CS11 to CS21 and CS12 to CS22. The first string selection transistors SSTa of different rows are connected to different string selection lines SSL1a to SSL2a, respectively. For example, first string selection transistors SSTa of the cell strings CS11 and CS12 are commonly connected to a string selection line SSL1a. First string selection transistors SSTa of the cell strings CS21 and CS22 are commonly connected to a string selection line SSL2a.

Second string selection transistors SSTb are of the same height (or order) in the cell strings CS11 to CS21 and CS12 to CS22. The second string selection transistors SSTb of different rows are connected to different string selection lines SSL1b to SSL2b, respectively. For example, second string selection transistors SSTb of the cell strings CS11 and CS12 are commonly connected to a string selection line SSL1b. First string selection transistors SSTb of the cell strings CS21 and CS22 are commonly connected to a string selection line SSL2b.

That is, cell strings of different rows are connected to different string selection lines. String selection transistors of the same height (or order) of the same row are connected to the same string selection line. String selection transistors of different heights (or orders) of the same row are connected to different string selection lines.

In example embodiments, string selection transistors of cell strings of the same row may be connected to a single string selection line. For example, string selection transistors SSTa and SSTb of a first row may be commonly connected to a single string selection line. String selection transistors SSTa and SSTb of cell strings CS21 and CS22 of a second row may be commonly connected to a single string selection line.

Columns of a plurality of cell strings CS11 to CS21 and CS12 to CS22 are connected to different bitlines BL1 and BL2, respectively. For example, string selection transistors SSTb of cell strings CS11 to CS21 of a first column are commonly connected to a bitline BL1. String selection transistors SST of cell strings CS12 to CS22 of a second column are commonly connected to a bitline BL2.

The cell strings of a same row may form a plane. For example, the cell strings CS11 and CS12 may form a first plane. The cell strings CS21 and CS22 may form a second plane.

In the memory block BLKa, write and read operations may be performed in units of rows. For example, a single plane of the memory block BLKa may be selected by string selection lines SSL1a, SSL1b, SSL2a, and SSL2b. When the string selection lines SSL1a and SSL1b are supplied with a turn-on voltage and the string selection lines SSL2a and SSL2b are supplied with a turn-off voltage, cell strings CS11 and CS12 of the first plane are connected to the bitlines BL1 and BL2, e.g., the first plane is selected. When the string selection lines SSL2a and SSL2b are supplied with a turn-on voltage and the string selection lines SSL1a and SSL1b are supplied with a turn-off voltage, cell strings CS21 and CS22 of the second plane are connected to the bitlines BL1 and BL2, e.g., the second plane is selected. In the selected plane, a single row of the memory cells MC may be selected by the wordlines WL1 to WL6. In the selected row, a write or read operation may be performed.

In the memory block BLKa, an erase operation may be performed in units of memory blocks or sub-blocks. When the erase operation is performed in units of memory blocks, all memory cells MC of the memory block BLKa may be erased at the same time according to a single erase request. When the erase operation is performed in units of sub-blocks, some of the memory cells MC of the memory block BLKa may be erased at the same time according to a single erase request and the memory cells MC may be erase-inhibited. A wordline connected to erased memory cells may be supplied with a low voltage (e.g., ground voltage), and a wordline connected to erase-inhibited memory cells may be floated.

In example embodiments, the memory block BLKa may include a physical storage space identified by a block address. Each of the wordlines WL1 to WL6 may correspond to a physical storage space identified by a row address. Each of the bitlines BL1 and BL2 may correspond to a physical storage space identified by a column address. Each of the string selection lines SSL1a and SSL2a or SSL1b and SSL2b of different rows or ground selection lines GSL1 and GSL2 of different rows may correspond to a physical storage space identified by a plane address.

The memory block BLKa shown in FIG. 2 is merely a non-limiting example. Example embodiments are not limited to the memory block BLKa shown in FIG. 2. For example, the number of rows of cell strings may increase or decrease relative to that shown in FIG. 2. As the number of the rows of the cell strings varies, the number of string selection lines or the number of ground selection lines connected to rows of cell strings and the number of cell strings connected to a single bitline may also vary.

The number of columns of cell strings may increase or decrease relative to that shown in FIG. 2. As the number of columns of cell strings varies, the number of bitlines connected to the columns of the cell strings and the number of cell strings connected to a single string selection line may also vary.

The height of cell strings may increase or decrease relative to that shown in FIG. 2. For example, the number of ground selection transistors, memory cells or string selection transistors stacked on the respective cell strings may increase or decrease relative to that shown in FIG. 2.

In example embodiments, memory cells MC that are connected to a single wordline and belong to a single row may correspond to at least two pages. For example, k bits (k being an integer greater than or equal to 2) may be programmed into a single memory cell. In memory cells MC that are connected to a single wordline and belong to a single row, k bits programmed into each of the memory cells MC may form k pages.

For example, a single physical page includes a physical storage space identified by a block address, a row address, a column address, and a plane address. A single physical page may include two or more logical pages corresponding to each of k bits stored in the memory cells of the physical page. Each of the logical pages may include a logical storage space identified by not only an address of a physical page but also an additional address (or offset) to identify the logical pages.

In example embodiments of inventive concepts, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiments of inventive concepts, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
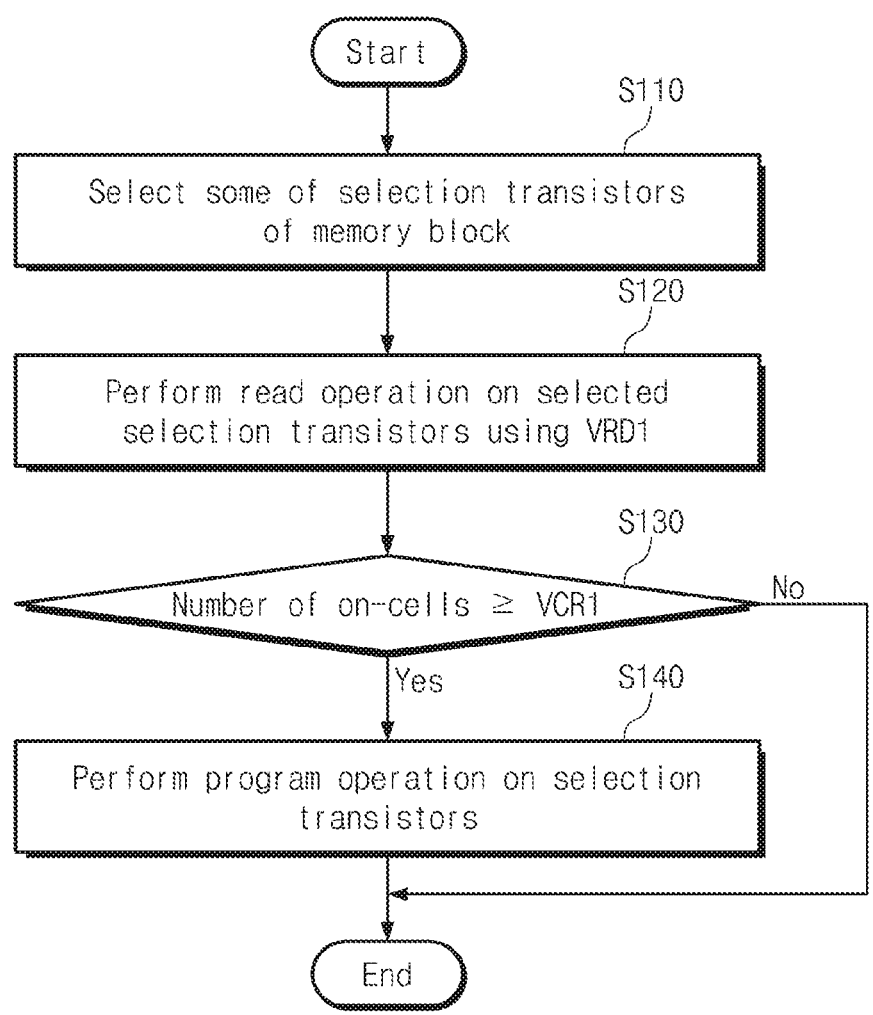
FIG. 3 is a flowchart summarizing an operating method of a storage device according to example embodiments of inventive concepts.

FIG. 3 is a flowchart summarizing an operating method of a storage device 100 according to example embodiments of inventive concepts. In example embodiments, a method for managing selection transistors (e.g., SSTa, SSTb, and GST) in the memory block BLKa in FIG. 2 by the selection transistor manager 128 in FIG. 1 is illustrated in FIG. 3. An example will be described where the selection transistor manager 128 manages string selection transistors SSTa adjacent to memory cells MC1 to MC6. However, example embodiments are not limited to management of the string selection transistors SSTa adjacent to the memory cells MC1 to MC6, and may be equivalently applied to other selection transistors (e.g., SSTb and GST).

Referring to FIGS. 1 to 3, some of selection transistors of a memory block are selected (S110). For example, the controller 120 may select some of string selection transistors SSTa adjacent to the memory cells MC1 to MC6 using the selection transistor manger 128. For example, the controller 120 may select string selection transistors SSTa of one or more planes of the memory block BLKa.

The controller 120 may perform a read operation on the selected string selection transistors SSTa using a first read voltage VRD1 (S120). For example, the first read voltage VRD1 may be one of the read voltages used in a read operation of the memory cells MC1 to MC6. On the other hand, the first read voltage VRD1 may have a different level than the read voltages used in the read operation of the memory cells MC1 to MC6. For example, the first read voltage VRD1 may be a ground voltage VSS or a low voltage having a similar level to the ground voltage VSS.

The controller 120 determines whether the number of on-cells turned on among the selected selection transistors during a read operation is greater than or equal to a first critical value VCR1 (S130). For example, the first critical value VCR1 may be value decided according to the number of string selection transistors SSTa belonging to a single page of each memory block, the number of error bits that may be corrected by the controller 120, reliability of the nonvolatile memory device 110, the degradation of the nonvolatile memory device 110, and the like. For example, the first critical value VCR1 may be decided at a ratio of 10 percent of the number of string selection transistors SSTa where a read operation is performed or at a ratio similar thereto. When the number of on-cells is greater than the first critical value VCR1, the controller 120 may perform a program operation on the string selection transistors SSTa (S140).

In summary, the controller 120 is configured to monitor some of the string selection transistors SSTa of each of the memory blocks BLK1 to BLKz. For example, the controller 120 may perform a read operation on some of the string selection transistors SSTa to monitor the some of the string selection transistors SSTa. The controller 120 may count the number of on-cells turned on during a read operation. When the number of string selection transistors having a threshold voltage lower than the first read voltage VRD1 is greater than or equal to the first critical value VCR1, the controller 120 may determine that string selection transistors SSTa of a corresponding memory block are degraded. Thus, the controller 120 may perform a program operation on the string selection transistors SSTa of the corresponding memory block to perform recovery of the string selection transistors SSTa.

In other example embodiments, the S130 may be performed by the nonvolatile memory device 110. For example, the nonvolatile memory device 110 may compare the number of the on-cells turned on during the read operation with the first critical value VCR1. The nonvolatile memory device 110 may transmit a result of the comparison to the controller 120. According to the result of the comparison received from the nonvolatile memory device 110, the controller 120 may determine whether or not to request the nonvolatile memory device 110 to perform a program operation on the string selection transistors SSTa.

FIG. 4 is a table for reference in describing methods (schemes) of selecting some of the string selection transistors SSTa using the selection transistor manager 128 by the controller 120 (S210). Referring to FIGS. 1 and 4, the controller 120 may select some of the string selection transistors SSTa using at least first to third schemes S1 to S3.

Referring to the description of the first scheme S1, the controller 120 may select at least one predetermined plane. For example, the controller 120 may be set to select a first plane. For example, when read operations are performed in the memory block BLKa to monitor the string selection transistors SSTa, the controller 120 may select the same planes. When read operations are performed in different memory blocks (e.g., BLK1 and BLKz) to monitor the string selection transistors SSTa, the controller 120 may select different planes. For example, predetermined monitor targets of respective memory block may be different from each other or the same as each other.

Referring to the description of the second scheme S2, the controller 120 may select at least one plane according to a pattern. For example, the controller 120 may alternately select first and second planes. When a first read operation is performed in the memory block BLKa to monitor the string selection transistors SSTa, the controller 120 may select the first plane. When a second read operation is performed in the memory block BLKa to monitor the string selection transistors SSTa, the controller 120 may select the second plane. For example, when read operations are performed two or more times in each memory block to monitor the string selection transistors SSTa, the controller 120 may select some of the string selection transistors SSTa according to a repeated pattern. For example, monitor patterns for respective memory blocks may be different from each other or the same as each other.

Referring to the description of the third scheme S3, the controller 120 may randomly select at least one plane. For example, the controller 120 may generate at least one random value (or pseudo-random value) within the range of the number of planes of each memory block and may select at least one plane corresponding to the generated at least one random value. For example, the controller 120 may select at least one random value or pseudo-random value using a block address of each memory block as a seed. For example, random values for respective memory blocks may be different from each other or the same as each other.

Figure 5:
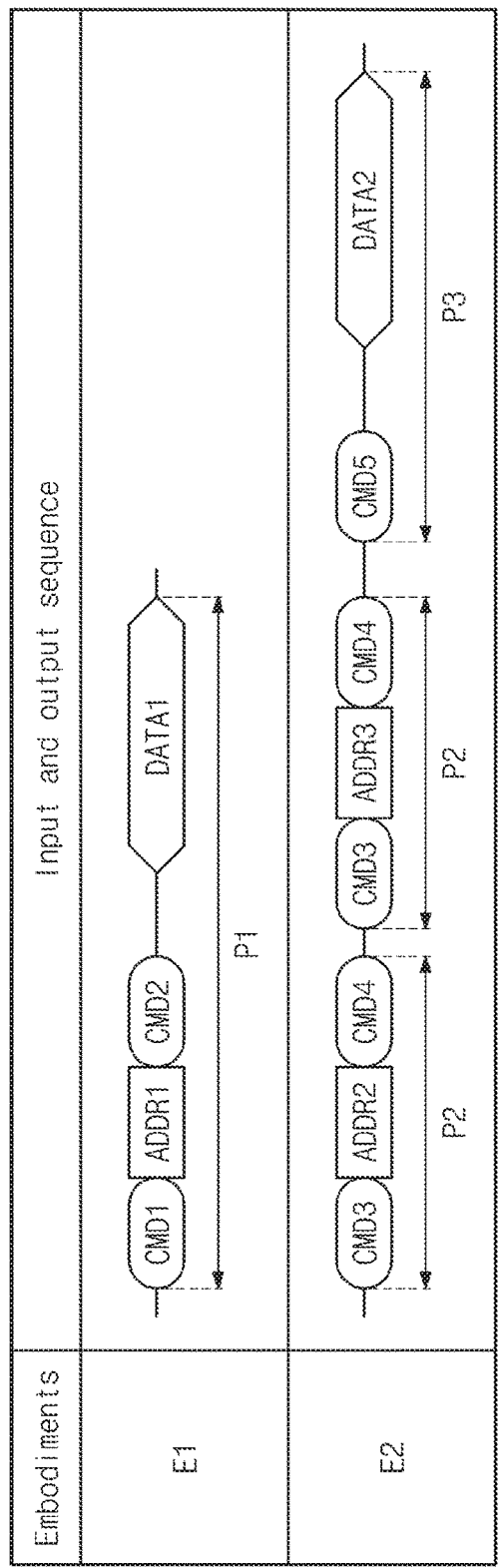
FIG. 5 is a timing diagram illustrating embodiments in which a storage device performs a read operation.

FIG. 5 is a timing diagram illustrating embodiments in which the storage device 100 performs a read operation (S120). Referring to FIGS. 1, 2, and 5, an input and output sequence of a first embodiment E1 includes a first phase P1. The first phase P1 may correspond to one of selected planes.

In the first phase P1, the controller 120 may sequentially transmit a first command CMD1 and a first address ADDR1 to the nonvolatile memory device 110. For example, the first command CMD1 and the first address ADDR1 may include information indicating a read operation on string selection transistors SSTa of the selected plane. For example, the first address ADDR1 may include the selected plane and the first command CMD1 may have a format defined to request a read operation on the string selection transistors SSTa of the selected plane. Alternatively, the first command CMD1 may have a format defined to request a read operation and may include information indicating the string selection transistors SSTa of the selected plane.

Subsequent to the first command CMD1 and the first address ADDR1, the controller 120 may transmit a second command CMD2 to the nonvolatile memory device 110. For example, the second command CMD2 may be a confirm command to request the operation of the nonvolatile memory device 110. In response to the second command CMD2, the nonvolatile memory device 110 may perform a read operation on the string selection transistors SSTa of the selected plane. The nonvolatile memory device 110 may transmit raw data read from the selection transistors SSTa to the controller 120 as first data DATA1.

When the number of selected planes is two or more, the controller 120 may repeat the first phase P1 a number of times corresponding to the number of selected planes. When the read operation on the selected planes is completed, the controller 120 may count the number of on-cells from the raw data received from the nonvolatile memory device 110. The controller 120 may compare a counted value with the first critical value VCR1 (see, e.g., FIG. 3 described previously) and may determine whether or not to perform a program operation according to a result of the comparison.

Alternatively, the nonvolatile memory device 110 may count the number of on-cells from the raw data. The nonvolatile memory device 110 may transmit a result of the counting to the controller 120 as first data DATA1. The controller 120 may sum up counted values corresponding to the selected planes and may compare a result of the summing up with the first critical value VCR1.

An input and output sequence of a second embodiment E2 includes a second phase P2 and a third phase P3. In the second phase P2, the controller 120 may transmit information on the selected planes to the nonvolatile memory device 110. In the third phase P3, the controller 120 may receive information on the string selection transistors SSTa of the selected planes from the nonvolatile memory device 110.

In the second phase P2, the controller 120 may sequentially transmit a third command CMD3 and a second address ADDR2 to the nonvolatile memory device 110. For example, the third command CMD3 and the second address ADDR2 may include information indicating a read operation on the string selection transistors SSTa of the selected plane. For example, the second address ADDR2 may indicate the selected plane and the third command CMD3 may have a format defined to request a read operation on the string selection transistors SSTa of the selected plane. Alternatively, the third command CMD3 may have a format defined to request a read operation and the second address ADDR2 may include information indicating the string selection transistors SSTa of the selected plane.

Subsequent to the third command CMD3 and the second command ADDR2, the controller 120 may transmit a fourth command CMD4 to the nonvolatile memory device 110. For example, the fourth command CMD4 may be a first confirm command to notify that transmission to a single plane is completed.

When the number of the selected planes is two or more, the controller 120 may repeat the second phase P2 a number of times corresponding to the number of the selected planes.

When transmission of the information on the selected planes is completed, the controller 120 transmits a fifth command CMD5 to the nonvolatile memory device 110 in the third phase P3. The fifth command CMD5 may be a second confirm command to request the operation of the nonvolatile memory device 110. In response to the fifth command CMD5, the nonvolatile memory device 110 may perform a read operation on the string selection transistors SSTa of the selected planes. The nonvolatile memory device 110 may transmit the raw data read from the string selection transistors SSTa of the selected planes or a counted value of bits indicating on-cells among the raw data to the controller 110 as second data DATA2.

Alternatively, the nonvolatile memory device 110 may compare the counted value of bits indicating on-cells among the raw data read from the string selection transistors SSTa of the selected planes with the first critical value VCR1. The nonvolatile memory device 110 may transmit a result of the comparison to the controller 110 as the second data DATA2.

FIG. 6 is a table for reference in describing an example of a method for performing a read operation of some of the string selection transistors SSTa according to example embodiments of inventive concepts. Referring to FIGS. 1, 2, and 6, first bitline voltages VBL1 are applied to first and second bitlines BL1 and BL2. The first bitline voltages VBL1 may be power supply voltages VCC or positive voltages between the power supply voltage VCC and a ground voltage VSS. For example, the first bitline voltages VBL1 may be positive voltages, for example, within the range between 0.5 volt and 1 volt.

A first pass read voltage VREAD1 is applied to a string selection line of a selected plane among string selection lines SST1b and SST2b connected to string selection transistors SSTb connected to the bitlines BL1 and BL2. The first pass read voltage VREAD1 may be a voltage to turn on the string selection transistors SSTb. A first off voltage VOFF1 is applied to a string selection line of an unselected plane among the string selection lines SST1b and SST2b connected to the string selection transistor SSTb connected to the bitlines BL1 and BL2. The first off voltage VOFF1 may be a voltage to turn off the string selection transistors SSTb. The first off voltage VOFF1 may be a ground voltage VSS or a voltage having a similar level to the ground voltage VSS.

A first read voltage VRD1 is applied to a selected one of the string selection lines SSL1a and SSL1b connected to string selection transistors SSTa adjacent to the memory cells MC1 to MC6, i.e., a string selection line of the selected plane that is a reading target. A second pass read voltage VREAD2 is applied to an unselected one of the string selection lines SSL1a and SSL1b connected to the string selection transistors SSTa adjacent to the memory cells MC1 to MC6, i.e., a string selection line of the unselected plane. The second pass read voltage VREAD2 may be a turn on voltage to turn on corresponding string selection transistors SSTb. The second pass read voltage VREAD2 may be a voltage that is identical to or different from one of the first pass read voltages VREAD1.

Third pass read voltages VREAD3 are applied to wordlines WL1 to WL6. The third pass read voltages VREAD3 may be voltages to turn on the memory cells MC1 to MC6. The third pass read voltages VREAD3 may be the same voltages or different voltages. Each of the third pass read voltages VREAD3 may be identical to or different from one of the first and second pass read voltages VREAD1 and VREAD2.

A fourth pass read voltage VREAD4 is applied to a ground selection line of the selected plane among the ground selection lines GSL1 and GSL2. The fourth pass read voltage VREAD4 may be a voltage to turn on the ground selection transistors GST. Each of the fourth pass read voltages VREAD4 may be identical to or different from one of the first and third pass read voltages VREAD1 and VREAD3. A second off voltage VOFF2 to turn off the ground selection transistors GST. The second off voltage VOFF2 may be the ground voltage VSS or a voltage having a similar level to the ground voltage VSS.

Figure 7:
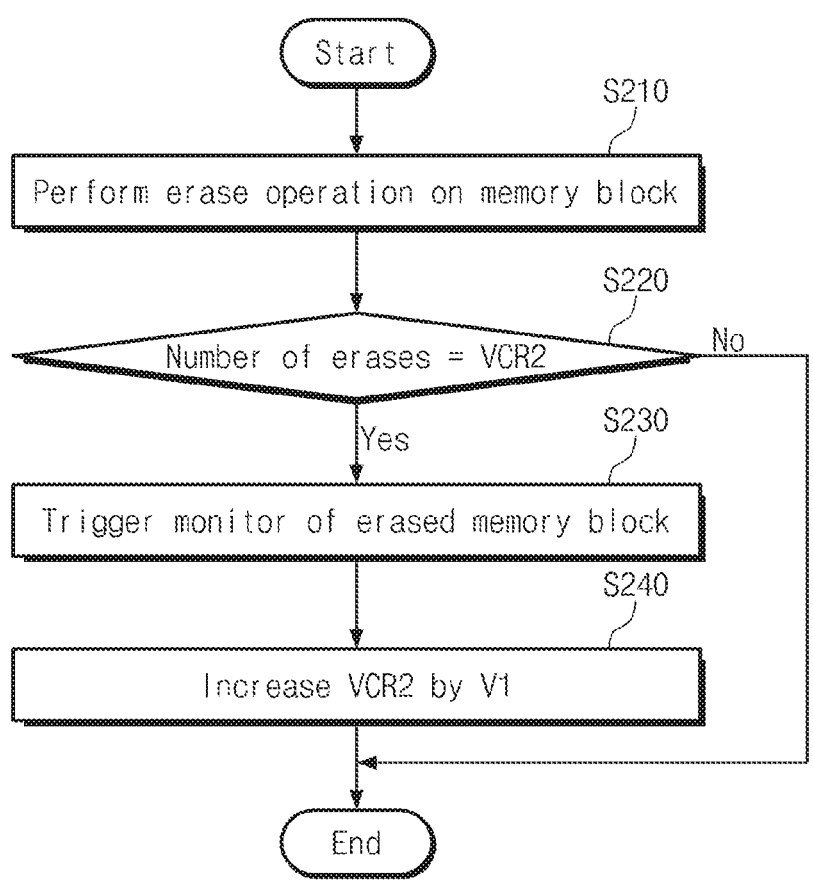
FIG. 7 is a flowchart summarizing an operating method of a storage device according to example embodiments of inventive concepts.

When a threshold voltage of the string selection transistor SSTa of the selected plane is lower than the first read voltage VRD1, a corresponding string selection transistor SSTa is turned on. Thus, a bitline voltage is discharged. When the threshold voltage of the string selection transistor SSTa of the selected plane is higher than the first read voltage VRD1, the corresponding string selection transistor SSTa is turned off. Thus, the bitline voltage is not discharged. That is, an on-cell and an off-cell among the string selection transistors SSTa of the selected plane may be determined depending on whether voltages of the first and second bitlines BL1 and BL2 are discharged FIG. 7 is a flowchart summarizing an operating method of the storage device 100 according to example embodiments of inventive concepts. In example embodiments, a method of determining whether or not to monitor selection transistors of a memory block is illustrated in FIG. 7.

Referring to FIGS. 1, 2, and 7, an erase operation is performed on a memory block (S210). For example, the controller 120 may transmit a command to request erasure and an address to select an erasure target to the nonvolatile memory device 110 to perform the erase operation on the memory block.

A determination is made as to whether an erase count reaches a second critical value VCR2 (S220). For example, the controller 120 may increase the erase count of a memory block on which an erase operation is performed. The controller 120 may determine whether the increased erase count reaches the second critical value VCR2. When the erase count does not reach the second critical value VCR2, monitoring is not performed (or triggered or scheduled) on the memory block on which the erase operation is performed. When the erase count reaches the second critical value VCR2, monitoring is triggered (or scheduled or performed) of the memory block on which the erase operation is performed (S230). For example, the operation described with reference to FIG. 3 may be performed.

Then, the second critical value VCR2 is increased by a first value V1 (S240). For example, the controller 120 may increase the second critical value VCR2, which is a criterion to perform monitoring of selection transistors in a memory block, by the first value V1.

As described above, the controller 110 may monitor string selection transistor SSTa of each memory block according to an erase count of each memory block. However, example embodiments are not limited to triggering string selection transistor monitoring based on an erase count. For example, the controller 110 may determine whether or not to monitor string selection transistors SSTa using one or a combination of two or more of various parameters. In addition to an erase count, examples of such parameters include a time elapsed after data is written into each memory block, the number of read operations performed in each memory block, and time when each memory block is left in an erased state.

In example embodiments, the second critical value VCR2 may be managed in each memory block. Alternatively, the second critical value VCR2 may be managed in each memory block group including two or more memory blocks.

FIG. 8 is a table for reference in describing methods of deciding a first value V1 added to a second critical value VCR2 (see S240 of FIG. 7 described above). Referring to FIGS. 1, 2, and 8, the controller 120 may decide the first value V1 according to one or a combination of two or more of schemes S4 to S10.

Referring to the description of the fourth scheme S4, the first value V1 may be a fixed value. For example, each of the memory blocks BLK1 to BLKz may have the fixed first value V1. First values V1 of different memory blocks may be equal to or different from each other.

Referring to the description of the fifth scheme S5, the first value V1 may be selected among a plurality of candidate values according to an erase count. For example, a first value V1 when an erase count of a memory block is within a first range may be different from a first value V1 when the erase count of the memory block is within a second range.

Referring to the description of the sixth scheme S6, the first value V1 may be a random value (or pseudo-random value) generated based on a fixed average. Averages of different memory blocks may be equal to or different from each other.

Referring to the description of the seventh scheme S7, the first value may be a random value (or pseudo-random value) generated based on a single value selected according to an erase count of a memory block among a plurality of candidate average values. For example, each of the memory blocks BLK1 to BLKz may have predetermined erase count ranges. Erase count ranges of different memory blocks may be identical to or different from each other. Average values when different memory blocks have the same erase counts may be equal to or different from each other.

Referring to the description of the eighth scheme S8, the first value V1 may be a random value (or pseudo-random value) generated within a fixed range. Ranges of the first value V1 of different memory blocks may be identical to or different from each other.

Referring to the description of the ninth scheme S9, the first value V1 may be a random value (or pseudo-random value) generated within a single range selected according to an erase count of a memory block among a plurality of candidate ranges. For example, a range of the first value V1 when the erase count of the memory block is within a first range may be different from a range of the first value V1 when the erase count of the memory block is within a second range. For example, each of the memory blocks BLK1 to BLKz may have a predetermined erase count range. Erase count ranges of different memory blocks may be identical to or different from each other. Ranges of the first value V1 when different memory blocks have the same erase count may be identical to or different from each other.

Referring to the description of the tenth scheme S10, the first value V1 may be a random value (or pseudo-random value) generated without limit.

Figure 9:
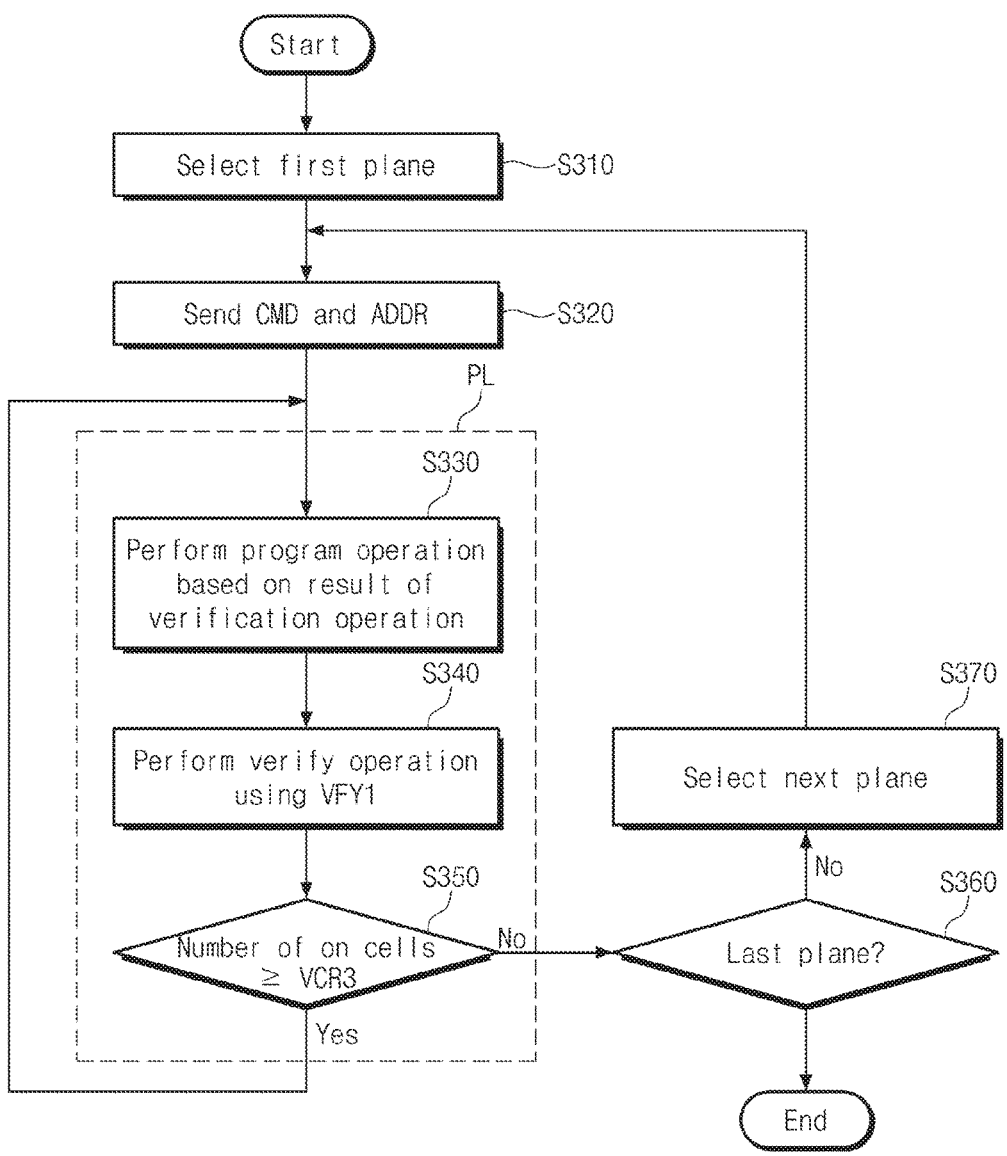
FIG. 9 is a flowchart summarizing an operating method of a storage device according to example embodiments of inventive concepts.

FIG. 9 is a flowchart summarizing an operating method of a storage device 100 according to example embodiments of inventive concepts. In example embodiments, an example of performing a program operation on degraded selection transistors (S140) is illustrated in FIG. 9.

Referring to FIGS. 1, 2, and 9, the controller 120 may select a first plane from a selected memory block (S310).

The controller 120 may transmit an address ADDR and a command CMD to request a program operation on string selection transistors SSTa of the selected plane (S320). For example, the address ADDR may indicate the selected plane and the command CMD may have a format defined to request a read operation on the string selection transistors SSTa of the selected plane. Alternatively, the command CMD may have a format defined to request a read operation and the address ADDR may include information indicating the string selection transistors SSTa of the selected plane. In example embodiments, the controller 120 may not transmit write data and may instead transmit only the address ADDR and the command CMD to request a program operation on the string selection transistors SSTa to the nonvolatile memory device 110.

The nonvolatile memory device 110 may perform a program loop PL in response to the address ADDR and the command CMD (S330 to S350).

A program operation may be performed on the string selection transistors SSTa (S330).

The nonvolatile memory device 110 may perform a verify operation using a first verify voltage VFY1 (S340). For example, the nonvolatile memory device 110 may perform a verify operation on string selection transistors SSTa of a selected plane of a selected memory block indicated by the address ADDR using the first verify voltage VFY1. For example, the verify operation may be performed based on the table shown in FIG. 6 by replacing the first read voltage VRD1 with the first verify voltage VFY1.

For example, the first verify voltage VFY1 may have the same level as the first read voltage VRD1 or a different level than the first read voltage VRD1. The first verify voltage VFY1 may have the same or similar level as a voltage of 1 volt.

The nonvolatile memory device 110 may determine whether the number of off-cells turned off during the verify operation is greater than or equal to a third critical value VCR3 (S350). That is, the nonvolatile memory device 110 may determine whether the number of string selection transistors having a threshold voltage lower than the first verify voltage VFY1 is greater than or equal to the third critical value VCR3. For example, the third critical value VCR3 may be decided according to the number of string selection transistors SSTa belonging to a single page of each memory block, the number of error bits that may be corrected by the controller 120, reliability of the nonvolatile memory device 100, degradation of the nonvolatile memory device 110, and the like. For example, the third critical value VCR3 may be decided at a ratio of 10 percent of the number of string selection transistors SSTa where a read operation is performed or at a ratio similar thereto.

When the number of on-cells is greater than or equal to the third critical value VCR3, the program loop PL is re-performed from the S330.

When the number of the on-cells is smaller than the third critical value VCR3, the flow proceeds to S360. The controller 120 determines whether a plane for which the program loop PL is performed is the last plane of the selected memory block (S360). When the plane for which the program loop is performed is not the last plane of the selected memory block, the next plane of the selected memory block is selected (S370). Afterwards, the flow returns to the S320. When the plane for which the program loop PL is performed is the last plane of the selected memory block, a program operation on the string selection transistors SSTa of the selected memory block is completed.

In example embodiments, the program loop PL may be repeated until the number of on-cells is made smaller than the third critical value VCR3 or the repeated number of the program loop PL reaches a critical value. When the number of on-cells is greater than or equal to 3 until the repeated number of the program loop PL reaches the critical value, a bad block process may be performed on the selected memory block. For example, the controller 120 may read valid data from a selected memory block of the nonvolatile memory device 110 and may write the read data into another memory block of the nonvolatile memory device 110. The controller 120 may designate the selected memory block of the nonvolatile memory device 110 as a bad block and may inhibit further access to the bad block.

In example embodiments, in a first program loop PL, the nonvolatile memory device 110 may select string selection transistors SSTa of a selected plane of a selected memory block as a program target. In a subsequent program loop PL, the nonvolatile memory device 110 may inhibit programming of off-cells turned off during a verify operation among the string selection transistors SSTa of the selected plane of the selected memory block and may select the turned-off on-cells as a program target.

Figure 10:
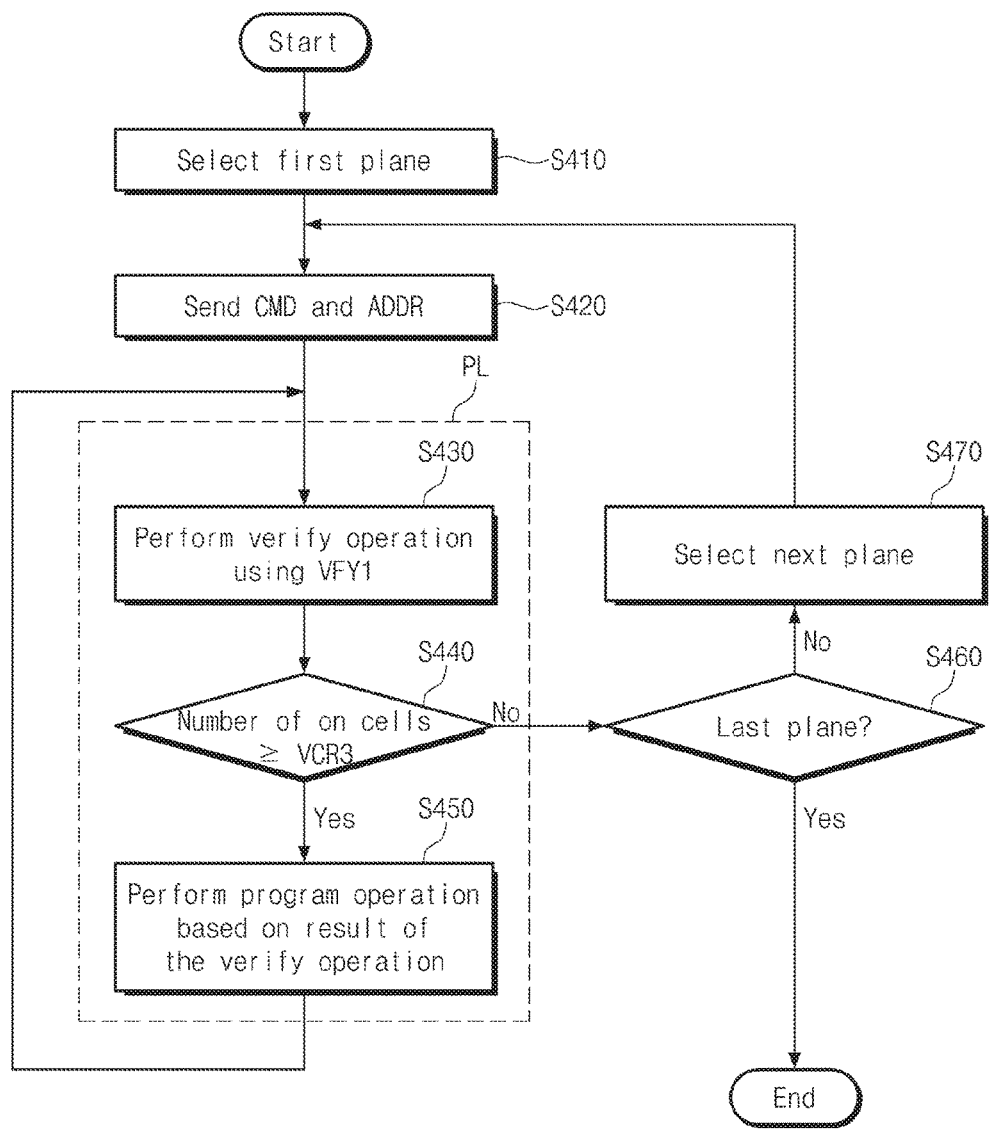
FIG. 10 is a flowchart summarizing an operating method of a storage device according to example embodiments of inventive concepts.

FIG. 10 is a flowchart summarizing an operating method of a storage device 100 according to example embodiments of inventive concepts. In example embodiments, another example of performing a program operation on degraded selection transistors is illustrated in FIG. 10.

Referring to FIGS. 1, 2, and 10, the controller 120 may select a first plane from a selected memory block (S410). The controller 120 may transmit an address ADDR and a command CMD to request a program operation on string selection transistors SSTa of the selected plane (S420). The S410 and S420 may be performed in the same manner as the S310 and S320 in FIG. 9.

The nonvolatile memory device 410 may perform a program loop PL in response to the command CMD and the address ADDR (S430 to S450).

The nonvolatile memory device 110 may perform a verify operation using a first verify voltage VFY1 (S430). For example, the nonvolatile memory device 110 may perform a verify operation on string selection transistors SSTa of a selected plane of a selected memory block indicated by the address ADDR using the first verify voltage VFY1.

The nonvolatile memory device 110 may determine whether the number of off-cells turned off during the verify operation is greater than or equal to a third critical value VCR3 (S440). That is, the nonvolatile memory device 110 may determine whether the number of string selection transistors having a threshold voltage lower than the first verify voltage VFY1 is greater than or equal to the third critical value VCR3. When the number of on-cells is greater than or equal to the third critical value VCR3, a program operation may be performed on the string selection transistors SSTa based on a result of the verify operation (S450). For example, the nonvolatile memory device 110 may inhibit programming of off-cells turned off during the verify operation among the string selection transistors SSTa of the selected plane of the selected memory block and may select the turned-on off-cells as a program target.

In example embodiments, the program loop PL may be repeated until the number of on-cells is made smaller than the third critical value VCR3 or the repeated number of the program loop PL reaches a critical value. When the number of the on-cells is greater than or equal to the third critical value VCR3 until the repeated number of the program loop PL reaches the critical value, a bad block process may be performed on the selected memory block.

When the number of the on-cells is smaller than the third critical value VCR3 (S440), the flow proceeds to S460. The controller 120 determines whether a plane where the program loop PL is performed is the last plane of the selected memory block (S460). When the plane where the program loop PL is performed is not the last plane of the selected memory block, the next plane of the selected memory block is selected (S470). Afterwards, the flow returns to the S420. When the plane where the program loop PL is performed is the last plane of the selected memory block, a program operation on the string selection transistors SSTa of the selected memory block is completed.

FIG. 11 is a table for reference in describing embodiments in which string selection transistors SSTa are programmed Referring to FIGS. 1, 2, and 11, a second bitline voltage VBL2 is applied to a selected bitline corresponding to an on-cell among first and second bitlines BL1 and BL2. The second bitline voltage VBL2 may have a ground voltage VSS or a low voltage having a similar level to the ground voltage VSS. A third bitline voltage VBL3 is applied to an unselected bitline corresponding to an off-cell among the first and second bitlines BL1 and BL2. The third bitline voltage VBL3 may be a power supply voltage VCC or a positive voltage having a similar level to the power supply voltage VCC. That is, the selected bitline is set to be a program target and the unselected bitline is program-inhibited.

First pass voltages VPASS1 are applied to string selection lines SSL1*b* and SSL2*b* adjacent to the first and second bitlines BL1 and BL2. The first pass voltages VPASS1 may be turn-on voltages to turn on string selection transistors SSTb. The first pass voltages VPASS1 may be the same voltages or different voltages.

A program voltage VPGM is applied to a selected string selection line of a selected plane among string selection lines SSL1*a* and SSL2*a* adjacent to the memory cells MC1 to MC6. The program voltage VPGM may be a high voltage having the highest level among voltages applied to the selected memory block during a program operation.

A string selection line voltage VSSL is applied to an unselected string selection line that does not correspond to the selected plane among the string selection lines SSL1a and SSL2a adjacent to the memory cells MC1 and MC6. The string selection line voltage VSSL may be a high voltage having a similar level the first pass voltage VPASS1 or the power supply voltage VCC.

Second pass voltages VPASS2 are applied to wordlines WL1 to WL6. The second pass voltages VPASS2 may be turn-on voltages to turn on the memory cells MC1 to MC6. The second pass voltages VPASS2 may be the same voltages or different voltages. Each of the second pass voltages VPASS2 may be a voltage that is identical to or different from one of the first pass voltages VPASS1 and the string selection line voltage VSSL.

Third off voltages VOFF3 are applied to ground selection lines GSL1 and GSL2. The third off voltages VOFF3 may be voltages to turn off ground selection transistors GST. The third off voltages VOFF3 may be a ground voltage VSS or low voltages having similar levels to the ground voltage VSS.

Figure 12:
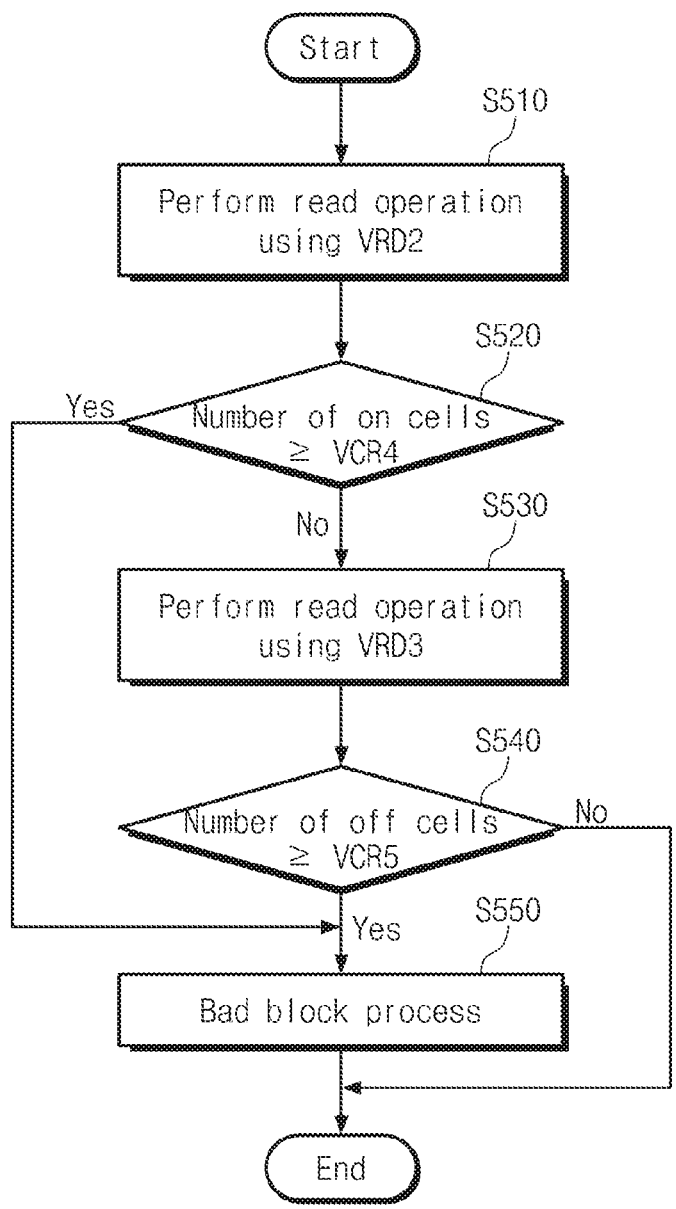
FIG. 12 is a flowchart summarizing an operating method of a storage device according to example embodiments of inventive concepts.

FIG. 12 is a flowchart summarizing an operating method of a storage device 100 according to example embodiments of inventive concepts. In example embodiments, a method for checking states of string selection transistors SSTa of a selected memory block after completion of a program operation of the string selection transistors SSTa is illustrated in FIG. 12.

Referring to FIGS. 1, 2, and 12, a first read operation is performed using a second read voltage VRD2 (S510). The first read operation may be performed on all or some planes belonging to a selected memory block. For example, the controller 120 may transmit an address and a command to request a first read operation on each plane to the nonvolatile memory device 110. The command may have a format to request a read operation on the string selection transistors SSTa, and the address may indicate a selected plane of a selected memory block. Alternatively, the command may have a format to request a read operation and the address may indicate string selection transistors SSTa of the selected plane of the selected memory block. For example, the controller 120 may transmit the command the address to the nonvolatile memory device 110 according to one of the embodiments E1 and E2 described with reference to FIG. 5 and may receive a reading result from the nonvolatile memory device 110.

In example embodiments, the second read voltage VRD2 may be a ground voltage VSS or a low voltage having a similar level to the ground voltage VSS. The second read voltage VRD2 may have the same or different level as or than the first read voltage VRD1 or the first verify voltage VFY1.

A determination is made as to whether the number of on-cells is greater than or equal to a fourth critical value VCR4 (S520). For example, the controller 120 may compare the number of turned-on on-cells, among the string selection transistors SSTa of planes where the first read operation is performed, with the fourth critical value VCR4.

The fourth critical value VCR4 may be value decided according to the number of string selection transistors SSTa belonging to a single page of each memory block, the number of error bits that may be corrected by the controller 120, reliability of the nonvolatile memory device 110, the degradation of the nonvolatile memory device 110, and the like. For example, the first critical value VCR1 may be decided at a ratio of 20 percent of the number of string selection transistors SSTa where a read operation is performed or at a ratio similar thereto.

When the number of the on-cells is smaller than the fourth critical value VCR4, the flow proceeds to S530. A second read operation is performed using a third read voltage VRD3 (S530). The second read operation may be performed on all or some planes belonging to the selected memory block. For example, the controller 120 may transmit an address and a command to request a second read operation on each plane to the nonvolatile memory device 110. The command may have a format to request a read operation on the string selection transistors SSTa, and the address may indicate the selected plane of the selected memory block. Alternatively, the command may have a command to request a read operation and the address may indicate the string selection transistors SSTa of the selected plane of the selected memory block. For example, the controller 120 may transmit the command the address to the nonvolatile memory device 110 according to one of the embodiments E1 and E2 described with reference to FIG. 5 and may receive a reading result from the nonvolatile memory device 110.

In example embodiments, the third read voltage VRD3 may be a voltage of 3 volts or a voltage having a similar level thereto. The third read voltage VRD3 may have the same or different level as or than the first read voltage VRD1, the first verify voltage VFY1 or the second read voltage VRD2.

A determination is made as to whether the number of the off-cells is greater than or equal to a fifth critical value VCR5 (S540). For example, the controller 120 may compare the number of turned-off off-cells, among the string selection transistors SSTa of the planes where the second read operation is performed, with the fifth critical value VCR5. The fifth critical value VCR5 may be value decided according to the number of string selection transistors SSTa belonging to a single page of each memory block, the number of error bits that may be corrected by the controller 120, reliability of the nonvolatile memory device 110, the degradation of the nonvolatile memory device 110, and the like. For example, the fifth critical value VCR5 may be decided at a ratio of 30 percent of the number of string selection transistors SSTa where a read operation is performed or at a ratio similar thereto.

When the number of the off-cells is smaller than the fifth critical value VCR5, the program operation on the string selection transistors SSTa of the selected memory block is determined to be successful. Afterwards, the selected memory block is normally used.

When the number of the on-cells is greater than or equal to the fourth critical value VCR4 (S520) or the number of the off-cells is greater than or equal to the fifth critical value VCR5 (S540), a bad block process is performed (S550). For example, the controller 120 may read valid data from a selected memory block of the nonvolatile memory device 110 and may write the read data into another memory block of the nonvolatile memory device 110. The controller 120 may designate the selected memory block of the nonvolatile memory device 110 as a bad block and may inhibit access to the bad block.

In example embodiments, target planes for the first read operation may be different from or identical with target planes of the second read operation and/or target planes of the read operation for monitoring as shown in FIG. 3. Similarly, target planes for the second read operation may be different from or identical with target planes of the first read operation and/or target planes of the read operation for monitoring as shown in FIG. 3.

As described above, the storage device 110 according to example embodiments of inventive concepts may perform an erase operation on a selected memory block and may compare an erase count of the selected memory block with the second critical value VCR2 (see FIG. 7). When the erase count of the selected memory block reaches the second critical value VCR2, the storage device 110 may monitor threshold voltages of some string selection transistors SSTa of the selected memory block through a read operation. When it is determined that the number of the on-cells is greater than or equal to the first critical value VCR1 during the read operation, the storage device 110 may perform a program operation on the string selection transistors SSTa of the selected memory block (see FIG. 3). After the program operation is completed, the storage device 110 may determine whether threshold voltages of the string selection transistors SSTa of the selected memory block is within the range (e.g., range between the second read voltage VRD2 and the third read voltage VRD3) through the first read operation and the second read operation (see FIG. 12). When a certain ratio or more of the threshold voltages of the string selection transistors SSTa is within the range, the storage device 100 may normally access the selected memory block. When monitoring of the selected memory block is completed, the storage device 110 may increase the second critical value VCR2 according to a set rule or at random (see FIG. 8).

As described in the foregoing example embodiments, among string selection transistors SSTa and SSTb disposed between the memory cells MC1 to MC6 and the bitlines BL1 and BL2, string selection transistors SSTa adjacent to the memory cells MC1 to MC6 are monitored and recovered. However, example embodiments of inventive concepts are not limited to the string selection transistors adjacent to the memory cells MC1 to MC6. Also the ground selection transistors GST or the string selection transistors SSTb adjacent to the bitlines BL1 and BL2 may be monitored and recovered according to example embodiments of inventive concepts.

FIG. 13 is a circuit diagram of a memory block BLKb according to example embodiments of inventive concepts. In contrast to the memory block BLKa shown in FIG. 2, the memory block BLKb of FIG. 13 includes two ground selection transistors GSTa and GSTb provided between memory cells MC1 to MC6 and a common source line CSL in each cell string. Rows of ground selection transistors GSTa adjacent to the common source line CSL are connected to ground selection lines GSL1a and GSL2a, respectively. Rows of the ground selection transistors GSTb adjacent to the memory cells MC1 to MC6 are connected to ground selection lines GSL1b and GSL2b, respectively.

Ground selection transistors GSTa or GSTb or string selection transistors SSTa or SSTb disposed at the same height from the common source line CSL may be monitored and recovered according to example embodiments of inventive concepts.

As described in the foregoing embodiments, the nonvolatile memory device 110 checks and recovers selection transistors according to the control of the controller 120. However, check and recovery of the selection transistors may be internally performed in the nonvolatile memory device 110. For example, the nonvolatile memory device 110 may check and recover the selection transistors during an idle time when a command is not transmitted from the controller 120.

For example, as described with reference to FIG. 7, the nonvolatile memory device 110 may determine whether or not to check selection transistors according to erase counts of memory blocks. As described with reference to FIG. 3, the nonvolatile memory device 110 may perform a read operation on some of selection transistors of a selected memory block and may determine whether or not to perform recovery. As described with reference to FIG. 9 or 10, the nonvolatile memory device 110 may program and recover selection transistors. As described with reference to FIG. 12, the nonvolatile memory device 110 may determine whether selection transistors are normally recovered. When a selected memory block is treated as a bad block, the nonvolatile memory device 110 may transmit information to the controller 120 to inform that the selected memory block must be treated as a bad block.

As described in the foregoing embodiments, check and recovery of selection transistors are performed in a single memory block. However, check and recovery of selection transistor may be performed in two or more memory blocks. For example, the nonvolatile memory device 110 may include a plurality of mats. The nonvolatile memory device 110 may perform write, read, and erase operations independently on each of the mats. While selection transistors of a first memory block of a first mat are checked and recovered, selection transistors of a second memory block of a second mat may be checked and recovered.

For example, a read operation according to FIG. 3 may be performed in the second memory block of the second mat while a read operation according to FIG. 3 is performed in the first memory block of the first mat. When a program operation and a verify operation described with reference to FIG. 9 or 10 are performed in the first memory block of the first mat, the program operation and the verify operation described with reference to FIG. 9 or 10 may be performed in the second memory block of the second mat. While a read operation according to FIG. 12 is performed in the first memory block of the first mat, the read operation according to FIG. 12 may be performed in the second memory block of the second mat. In example embodiments, a read operation, a program operation, and a verify operation may be simultaneously performed in the first memory block of the first mat and the second memory block of the second mat at the same timing.

Returning to FIG. 1, the nonvolatile memory device 110 may perform write, read, and erase operations according to the control of the controller 120. The nonvolatile memory device 110 may receive a command and an address from the controller 120 via an input/output channel. The nonvolatile memory device 110 may exchange data with the controller 120 via the input/output channel.

The nonvolatile memory device 110 may exchange a control signal with the controller 120 via a control channel. For example, the nonvolatile memory device 110 may receive, from the controller 120, a chip enable signal /CE to select at least one of a plurality of nonvolatile memory chips of the nonvolatile memory device 110, a command latch enable signal CLE to indicate that a signal received from the controller 120 via the input/output channel is a command, an address latch enable signal ALE to indicate that a signal received from the controller 120 via the input/output channel is an address, a read enable signal /RE generated by the controller 120 and periodically toggled to be used to adjust timings during a read operation, a write enable signal /WE enabled by the controller when the command or the address is transmitted, a write protect signal /WP enabled by the controller 120 to prevent an unintentional write or erase operation when power is changed, and a data strobe signal DQS generated by the controller 120 and periodically toggled to be used to adjust synchronization of data transmitted via the input/output channel. For example, the nonvolatile memory device 110 may output, to the controller 120, a ready/busy signal R/nB to indicate whether the nonvolatile memory device 110 is performing a program, erase or read operation and a data strobe signal DQS generated from the read enable signal /RE by the nonvolatile memory device 110 and periodically toggled to be used to adjust output synchronization of data.

The nonvolatile memory device 110 may include a flash memory. However, elements included in the nonvolatile memory device 110 are not limited to the flash memory. The nonvolatile memory device 110 may include at least one of various nonvolatile memory devices such as phase-change RAM (PRAM), magnetic RAM (MRAM), resistive RAM (RRAM), and ferroelectric RAM (FRAM).

The controller 120 is configured to control the nonvolatile memory device 110. For example, the controller 120 may control the nonvolatile memory device 110 via an input/output channel and a control channel such that the nonvolatile memory device 110 performs a write, read or erase operation.

The controller 120 may control the nonvolatile memory device 110 according to the control of an external host device (not shown). For example, the controller 120 may communicate with the external host device according to a format different from a format to communicate with the nonvolatile memory device 110. A unit of data where the controller 120 communicates with the nonvolatile memory device 110 may be different from a unit of data where the controller 120 communicates with the external host device.

The controller 120 may use the RAM 130 as a buffer memory, a cache memory or a working memory. The controller 120 may store data or a code required to manage the nonvolatile memory device 110 in the RAM 130. For example, the controller 120 may read data or a code required to manage the nonvolatile memory device 110 from the nonvolatile memory device 110 and may load the read data or code in the RAM 130 to drive the RAM 130.

The RAM 130 may include at least one of various random access memory devices such as dynamic RAM (DRAM), static RAM (SRAM), synchronous DRAM (SDRAM), phase-change RAM (PRAM), magnetic RAM (MRAM), resistive RAM (RRAM), and ferroelectric RAM (FeRAM).

The nonvolatile memory device 110 may include a plurality of memory chips. In example embodiments, the controller 120 and the nonvolatile memory chips may be connected to each other based on a channel and a way. A single channel may include a single data channel and a single control channel. A single data channel may include eighth data lines. The single control channel may include control lines to transmit the chip enable signal /CE, the command latch enable signal CLE, the address latch enable signal ALE, the read enable signal /RE, the write enable signal /WE, the write protect signal /WP, and the ready and busy signal R/nB.

Nonvolatile memory chips connected to a single channel may form a way. If n nonvolatile memory chips are connected to a single channel, an n-way may be formed. Nonvolatile memory chips belonging to a single way may share data lines and control lines to transmit the command latch enable signal CLE, the address latch enable signal ALE, the read enable signal /RE, the write enable signal /WE, and the write protect signal /WP. Each of the nonvolatile memory chips belonging to the single way may communicate with the controller 120 through dedicated control lines to transmit the chip enable signal /CE and the ready and busy signal R/nB.

The controller 120 may alternately access the nonvolatile memory chips of the n-way connected to the single channel. The controller 120 may independently access nonvolatile memory chips connected to different channels. The controller 120 may alternately or simultaneously access nonvolatile memory chips connected to the different channels.

In example embodiments, the nonvolatile memory chips may be connected to the controller 120 in the form of Wide IO. For example, the nonvolatile memory chips connected to the different channels may share a control line of a single chip enable signal /CE. The nonvolatile memory chips sharing the control line of the single chip enable signal /CE may be accessed at the same time. Since data lines of the different channels are used at the same time, broad input/output bandwidth may be achieved.

The storage device 100 may include a solid state drive (SSD) or a hard disk drive (HDD). The storage device 100 may include memory cards such as a personal computer memory card international association (PCMCIA), a compact flash card (CF), smart media cards (SM and SMC), a memory stick, multimedia cards (MMC, RS-MMC, and MMCmicro), SD cards (SD, miniSD, microSD, and SDHC), a universal serial bus (USB) memory card, and a universal flash storage (UFS). The storage device 100 may include an embedded memory such as embedded multimedia card (eMMC), UFS, and perfect page NAND (PPN).

As shown in FIG. 1, the storage device 100 includes the RAM disposed outside the controller 120. However, the storage device 100 may not include the RAM 130 disposed outside the controller 120. The controller 120 may be configured to use an internal RAM (see FIG. 14) as a buffer memory, a working memory or a cache memory.

Figure 14:
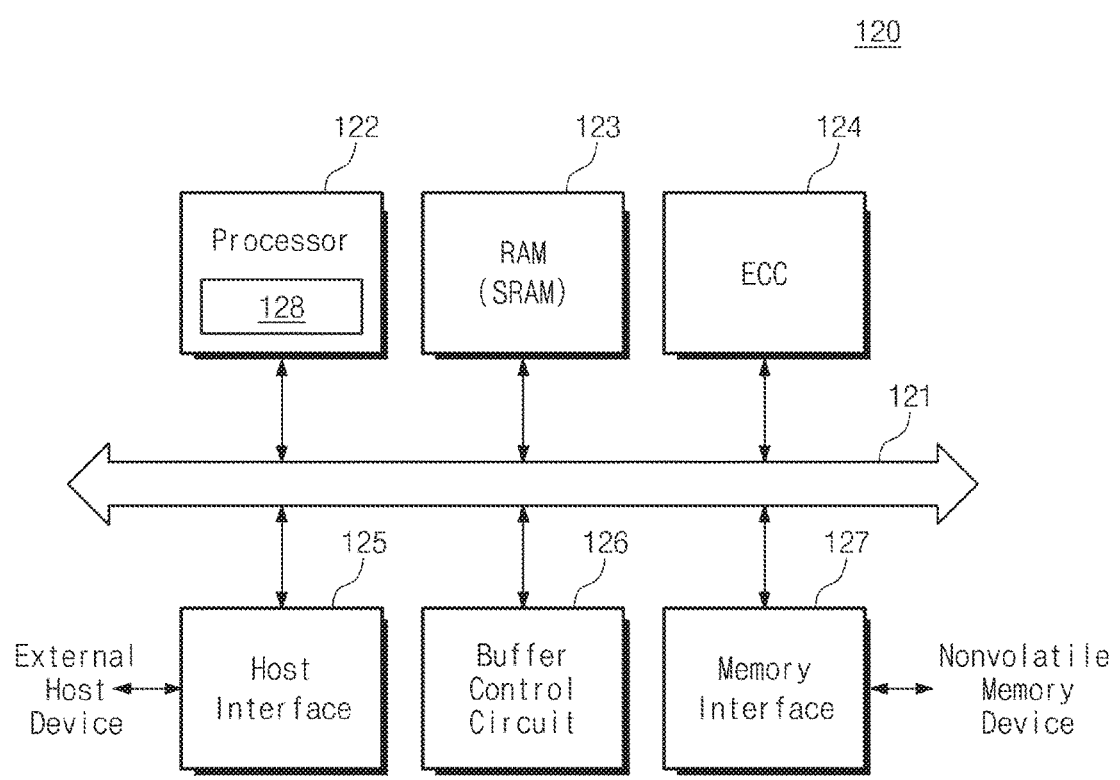
FIG. 14 is a block diagram of a controller according to example embodiments of inventive concepts.

FIG. 14 is a block diagram of a controller 120 according to example embodiments of inventive concepts. Referring to FIGS. 1 and 14, the controller 120 may include a bus 121, a processor 122, a RAM 123, an error correction code block (ECC) 124, a host interface 125, a buffer control circuit 126, and a memory interface 127.

The bus 121 is configured to provide a channel between components of the controller 120.

The controller 122 may control the overall operation of the controller 120 and perform a logical operation. The processor 122 may communicate with an external host device through the host interface 125, communicate with the nonvolatile memory device 110 through the memory interface 127, and communicate with the RAM 130 through the buffer control circuit 126. The processor 122 may use the RAM 123 as a working memory, a cache memory or a buffer memory to control the storage device 100.

The RAM 123 may be used as a working memory, a cache memory or a buffer memory of the processor 122. The RAM 123 may store codes and command that the processor 122 executes. The RAM 123 may store data processed by the processor 122. The RAM 123 may include a static RAM (SRAM).

The ECC 124 may perform error correction. The ECC 124 may perform error correction encoding based on data written into the nonvolatile memory device 110 through the memory interface 127. Error-correction-encoded data may be transmitted to the nonvolatile memory device 110 through the memory interface 127. The ECC 124 may perform error correction decoding on data received from the nonvolatile memory device 110 through the memory interface 127. In example embodiments, the ECC 124 may be included in the memory interface 127 as a component of the memory interface 127.

The host interface 125 is configured to communicate with an external device according to the control of the processor 122. The host interface 125 may be configured to perform communication using at least one of various communication protocols such as USB (Universal Serial Bus), SATA (Serial AT Attachment), SAS (Serial Attached SCSI), HSIC (High Speed Interchip), SCSI (Small Computer System Interface), PCI (Peripheral Component Interconnection), PCIe (PCI express), NVMe (NonVolatile Memory express), UFS (Universal Flash Storage), SD (Secure Digital), MMC (MultiMedia Card), eMMC (embedded MMC), DIMM (Dual In-line Memory Module), RDIMM (Registered DIMM), and LRDIMM (Load Reduced DIMM).

The buffer control circuit 126 is configured to control the RAM 130 according to the control of the processor 122.

The memory interface 127 is configured to communicate with the nonvolatile memory device 110 according to the control of the processor 122. As described with reference to FIG. 1, the memory interface 127 may allow a command, an address, and data to communicate with the nonvolatile memory device 110 through an input/output channel. The memory interface 127 may allow a control signal to communicate with the nonvolatile memory device 110 through a control channel.

In example embodiments, when the RAM 130 is not provided to the storage device 100, the buffer control circuit 126 may not be provided to the controller 120.

In example embodiments, the processor 122 may control the controller 120 using codes. The processor 122 may load codes from a nonvolatile memory device (e.g., ROM) provided in the controller 120. Alternatively, the processor 122 may load codes from the nonvolatile memory device 110 through the memory interface 127.

The processor 122 includes a selection transistor manager 128. The selection transistor manager 128 may be provided in the form of hardware manufactured as a part of the processor 122, software executed in the processor 122 or a combination of the hardware and the software.

In example embodiments, the bus 121 of the controller 120 may be divided into a control bus and a data bus. The data bus may be configured to transmit data in the controller 120 and to transmit control information such as a command and an address in the controller 120. The data bus and the control bus may be separated from each other and may not interfere with each other or may not have an influence on each other. The data bus may be connected to the host interface 125, the buffer control circuit 126, the ECC 124, and the memory interface 127. The control bus may be connected to the host interface 125, the processor 122, the buffer control circuit 126, the RAM 123, and the memory interface 127.

Figure 15:
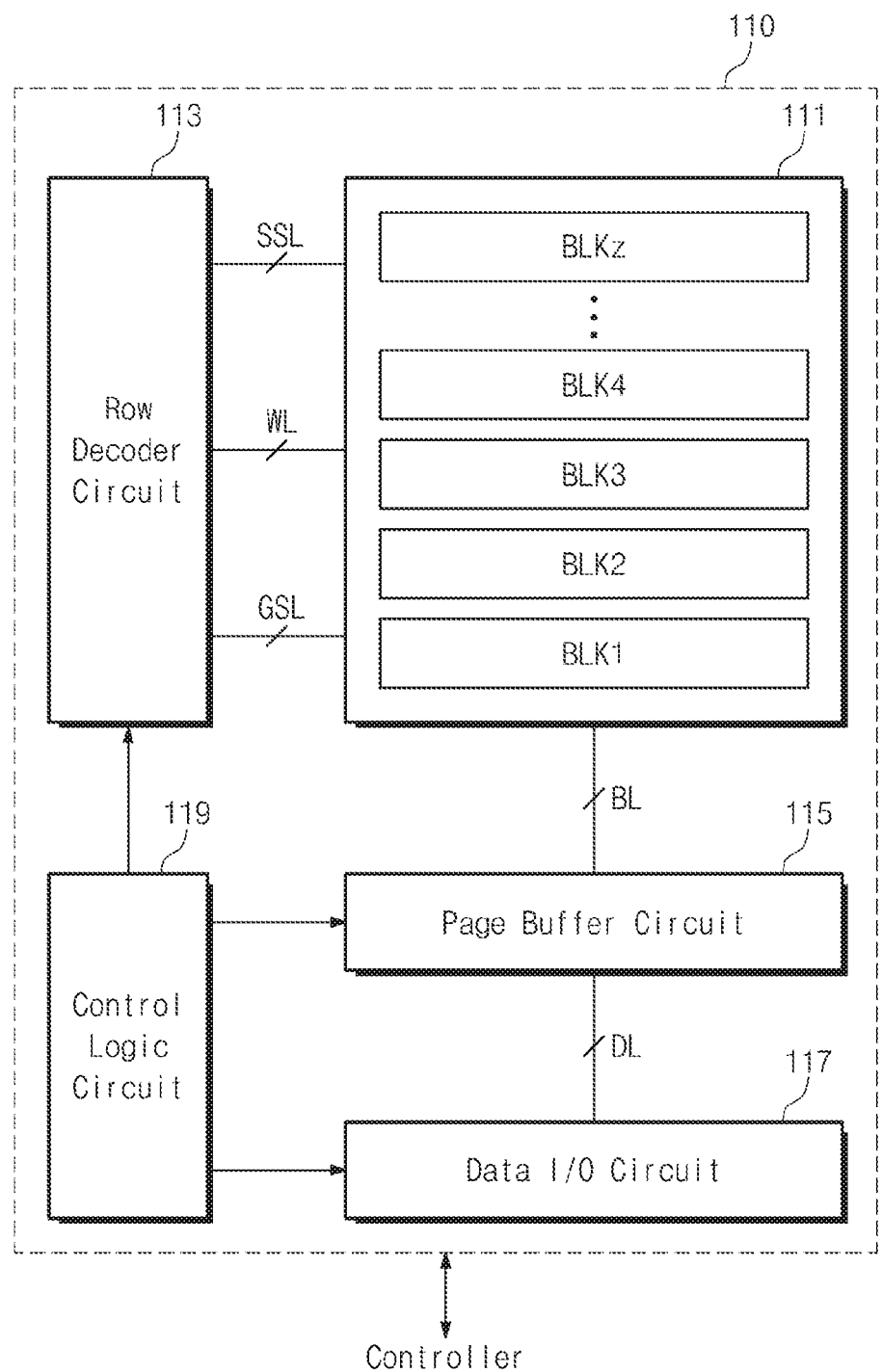
FIG. 15 is a block diagram of a nonvolatile memory device according to example embodiments of inventive concepts.

FIG. 15 is a block diagram of a nonvolatile memory device 110 according to example embodiments of inventive concepts. Referring to FIGS. 1 and 15, the nonvolatile memory device 110 includes a memory cell array 111, a row decoder circuit 113, a page buffer circuit 115, a data input/output circuit 117, and a control logic circuit 119.

The memory cell array 111 may include a plurality of memory blocks BLK1 to BLKz. Each of the memory blocks BLK1 to BLKz includes a plurality of memory cells. Each of the memory blocks BLK1 to BLKz may be connected to the address decoder circuit 113 through at least one ground selection line GSL, a plurality of wordlines WL, and at least one string selection line SSL. Each of the memory blocks BLK1 to BLKz may be connected to a page buffer circuit 115 through a plurality of bitlines BL. The memory blocks BLK1 to BLKz may be commonly connected to the bitlines BL. Memory cells of the memory blocks BLK1 to BLKz may have the same structure.

In example embodiments, each of the memory blocks BLK1 to BLKz may be a unit of an erase operation. Memory cells of the memory cell array 111 may be erased in units of a single memory block. Memory blocks belonging to a single memory block may be erased at the same time. Alternatively, in example embodiments, each of the memory blocks BLK1 to BLKz may be divided into a plurality of sub-blocks and each of the sub-blocks may be a unit of an erase operation.

In example embodiments, each of the memory blocks BLK1 to BLKz may include a physical storage space identified by a block address. Each of the wordlines WL may correspond to a physical storage space identified by a row address. Each of the bitlines BL may correspond to a physical storage space identified by a column address.

The address decoder circuit 113 is connected to the memory cell array 111 through a plurality of ground selection lines GSL, a plurality of wordlines WL, and a plurality of string selection lines SSL. The address decoder circuit 113 operates according to the control of the control logic circuit 119. The address decoder circuit 113 may receive a first address ADDR1 from the memory controller 120. The address decoder 113 may decode the received first address ADDR1 and control voltages applied to the wordlines WL according to the decoded address.

For example, during a program operation, the address decoder circuit 113 may apply a program voltage VGPM to a selected wordline of a selected memory block selected by an address and apply a pass voltage VPASS to unselected wordlines of the selected memory block. During a read operation, the address decoder circuit 113 may apply a select read voltage VRD to the selected wordline of the selected memory block and apply an unselect read voltage VREAD to unselected wordlines of the selected memory. During an erase operation, the address decoder circuit 113 may apply an erase voltage (e.g., ground voltage or low voltages having similar levels to the ground) to wordlines of the selected memory block.

The page buffer circuit 115 is connected to the memory cell array 111 through a plurality of bitlines BL. The page buffer circuit 115 is connected to the data I/O circuit 117 through a plurality of data lines DL. The page buffer circuit 115 operates according to the control of the control logic circuit 119.

During the program operation, the page buffer circuit 115 may store data to be programmed into memory cells. The page buffer circuit 115 may apply voltages to a plurality of bitlines BL based on the stored data. For example, the page buffer circuit 115 may function as a write driver. During a read operation, the page buffer circuit 115 may sense voltages of the bitlines BL and store a sensing result. For example, the page buffer circuit 115 may function as a sense amplifier.

The data I/O circuit 117 is connected to the page buffer circuit 115 through a plurality of data lines DL. The data I/O circuit 117 may output data read by the page buffer circuit 115 to the controller 120 through an input/output channel and transmit data received from the controller 120 through the input/output channel to the page buffer circuit 115.

The control logic circuit 119 may receive a command from the controller 120 through the input/output channel and receive a control signal through the control channel. The control logic circuit 119 may receive a command received through the input/output channel in response to a control signal, route an address received through the input/output channel to the decoder circuit 113, and route data received through the input/output channel to the data input/output circuit 117. The control logic 119 may decode the received command and control the nonvolatile memory 110 according to the decoded command.

In example embodiments, during a read operation, the control logic circuit 119 may generate a data strobe signal DQS from a read enable signal /RE received from the controller 120 through the control channel. The generated data strobe signal DQS may be output to the controller 120 through the control channel. During a write operation, the control logic circuit 119 may receive the data strobe signal DQS from the controller 120 through the control channel.

Figure 16:
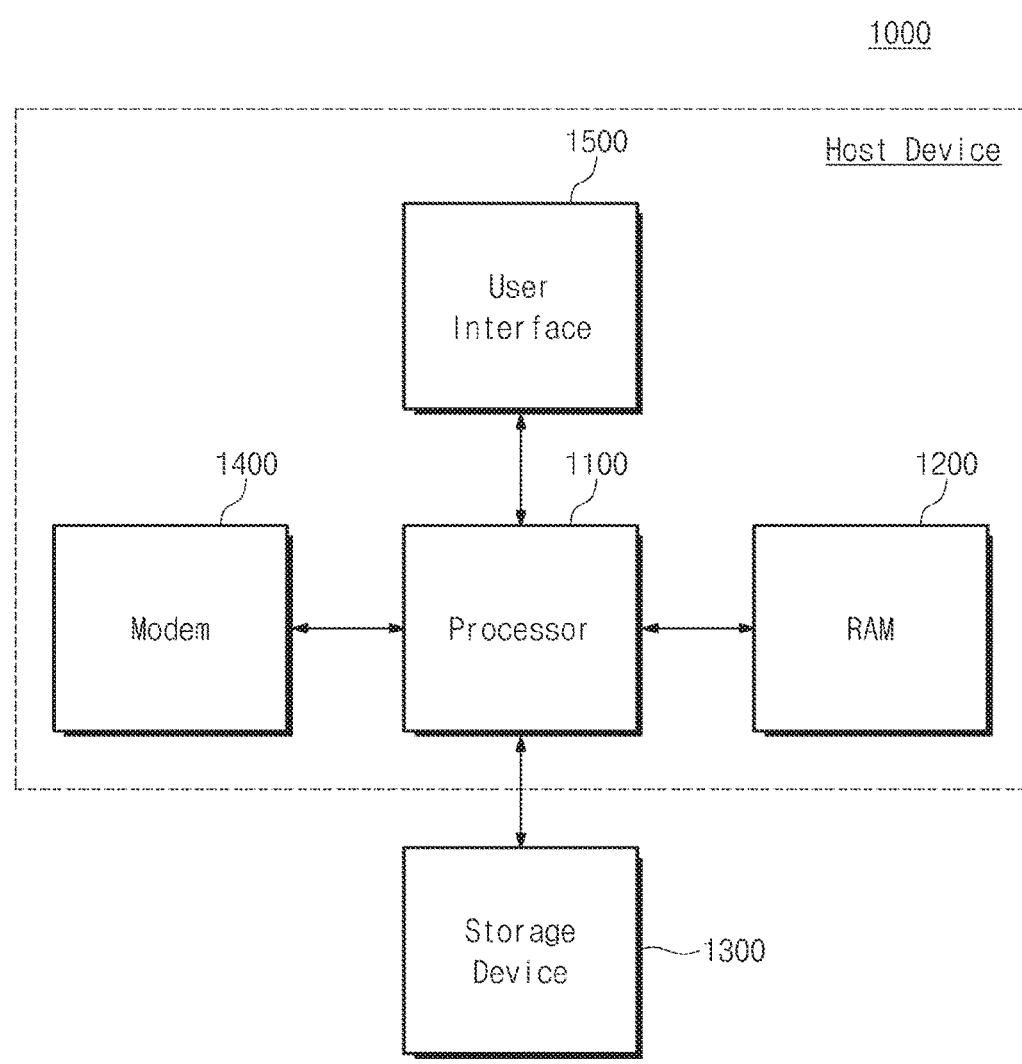
FIG. 16 is a block diagram of a computing device according to example embodiments of inventive concepts.

FIG. 16 is a block diagram of a computing device 1000 according to example embodiments of inventive concepts. As illustrated, the computing device 1000 includes a processor 1100, a RAM 1200, a storage device 1300, a modem 1400, and a user interface 1500.

The processor 1100 may control the overall operation of the computing device 1000 and performs a logical operation. The processor 1100 may be a hardware-implemented data processing device having circuitry that is physically structured to execute desired operations represented as code and/or instructions included in a program. For example, the processor 1100 may include a system-on-chip (SoC). The processor 1100 may be a general-purpose processor, a specific-purpose processor or an application processor.

The RAM 1200 may communicate with the processor 1100. The RAM 1200 may be a main memory of the processor 1100 or the computing device 1000. The processor 1100 may temporarily store a code or data in the RAM 1200. The processor 1100 may execute a code and process data using the RAM 1200. The processor 1100 may execute various types of software such as an operating system and an application using the RAM 1200. The processor 1100 may control the overall operation of the computing device 1000 using the RAM 1200. The RAM 1200 may include a volatile memory such as a static RAM (SRAM), a dynamic RAM (DRAM), a synchronous DRAM (SDRAM) or a nonvolatile memory such as a phase-change RAM (PRAM), a magnetic RAM (MRAM), a resistive RAM (RRAM), and a ferroelectric RAM (FRAM).

The storage device 1300 may communicate with the processor 1100. The storage device 1300 may store data for a relatively long time. That is, the processor 1100 may store data to be preserved for a relatively long time in the storage device 1300. The storage device 1300 may store a boot image to drive the computing device 1000. The storage device 1300 may store source codes of various types of software such as an operating system and an application. The storage device 1300 may store data processed as a result of the execution of various types of software such as an operating system and an application.

In example embodiments, the processor 1100 may load the source codes stored in the storage device 1300 to the RAM 1200 and execute the codes loaded to the RAM 1200 to drive the various types of software such as an operating system and an application. The processor 1100 may load the data stored in the storage device 1300 to the RAM 1200 and process the data loaded to the RAM 1200. The processor 1100 may store data that needs to be preserved for a relatively long time, among the data stored in the RAM 1200, in the storage device 1300.

The storage device 1300 may include a nonvolatile memory such as a flash memory, a phase-change RAM (PRAM), a magnetic RAM (MRAM), a resistive RAM (RRAM), and a ferroelectric RAM (FRAM).

The modem 1400 may communicate with an external device according to the control of the processor 1100. For example, the modem 1400 may perform wired or wireless communications with an external device. The modem 1400 may perform communications based on one or more of a plurality of wireless communication techniques or protocols including, for example, LTE (Long Term Evolution), WiMax, GSM (Global System for Mobile communication), CDMA (Code Division Multiple Access), Bluetooth, NFC (Near Field Communication), WiFi, and RFID (Radio Frequency Identification), and/or one or more of a plurality of wired communication techniques or protocols including, for example, USB (Universal Serial Bus), SATA (Serial AT Attachment), SCSI (Small Computer Small Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), eMMC (embedded MMC).

The user interface 1500 may communicate with a user according to the control of the processor 1100. For example, the user interface 1500 may include one or more user input interfaces. Examples of the one or more user input interfaces include a keyboard, a keypad, a button, a touch panel, a touch screen, a touch pad, a touch ball, a camera, a microphone, a gyroscope sensor, and a vibration sensor. The user interface 1500 may include one or more user output interfaces. Examples of the one or more user output interfaces include a liquid crystal display (LCD), an organic light emitting diode (OLED) display, an active matrix OLED (AMOLED), an LED, a speaker, and a monitor.

The storage device 1300 may include a storage device 100 according to example embodiments of inventive concepts. The processor 1100, the RAM 1200, the modem 1400, and the user interface 1500 may constitute a host device communicating with the storage device 1300.

As described above, degradation of selection transistors is monitored and degraded selection transistors are programmed Thus, a storage device with improved reliability may be realized.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A storage device comprising:
   a nonvolatile memory device including memory blocks; and
   a controller configured to control the nonvolatile memory device, wherein:
   each of the memory blocks includes a plurality of cell strings each including selection transistors and a plurality of memory cells stacked on a substrate in a direction perpendicular to the substrate, the controller controls the nonvolatile memory device to perform a read operation on some of the selection transistors of a selected one of the memory blocks, and to perform a program operation on the selection transistors of the selected memory block according to a result of the read operation, and the selection transistors of each of the cell strings include a ground selection transistor provided between the memory cells and the substrate and a first string selection transistor stacked on the memory cells.

2. The storage device as set forth in claim 1, wherein the selection transistors of each of the cell strings also include a second string selection transistor stacked on the first string selection transistor.

3. The storage device as set forth in claim 1, wherein the controller is configured to perform the read operation on some of the first string selection transistors of the cell strings and to perform the program operation on the first string selection transistors of the cell strings.

4. The storage device as set forth in claim 1, wherein the controller is configured to perform the program operation when the number of selection transistors turned on during the read operation is greater than or equal to a critical value.

5. The storage device as set forth in claim 1, wherein the some of the selection transistors of the selected memory block are predetermined, selected according to a pattern, or selected at random.

6. The storage device as set forth in claim 1, wherein the nonvolatile memory device is configured to output raw data resulting from the read operation or a value obtained by counting the number of turned-on selection transistors resulting from the read operation.

7. The storage device as set forth in claim 1, wherein the controller controls the nonvolatile memory device to perform the read operation when an erase count of the selected memory block reaches a critical value corresponding to the selected memory block.

8. The storage device as set forth in claim 7, wherein the controller increases the critical value by a predetermined value, a random value having a predetermined average, or a random value within a predetermined range when the read operation is performed.

9. The storage device as set forth in claim 8, wherein the predetermined value, the predetermined average, or the predetermined range are adjusted according to the erase count of the selected memory block.

10. The storage device as set forth in claim 1, wherein the nonvolatile memory device is configured to perform the program operation by repeatedly performing a program loop to sequentially perform a verify operation and a sub-program operation on the selection transistors of the selected memory block.

11. The storage device as set forth in claim 10, wherein a read voltage used in the read operation and a verify voltage used in the verify operation are different from each other.

12. The storage device as set forth in claim 1, wherein the controller controls the nonvolatile memory device to perform a first read operation using a first read voltage and a second read operation using a second read voltage which is higher than the first read voltage on the selection transistors of the selected memory block after the program operation is completed.

13. The storage device as set forth in claim 12, wherein the controller is configured to treat the selected memory block as a bad block when the number of selection transistors turned on during the first read operation is greater than a first critical value or the number of selection transistors turned off during the second read operation is greater than a second critical value.

14. The storage device as set forth in claim 12, wherein a read voltage used in the read operation is different from the first read voltage or the second read voltage.

15. A storage device comprising:
a nonvolatile memory device including memory blocks; and
a controller configured to control the nonvolatile memory device, wherein:
each of the memory blocks includes a plurality of cell strings each including at least one selection transistor and a plurality of memory cells stacked on a substrate in a direction perpendicular to the substrate, the controller is configured to perform a read operation on at least some of the at least one selection transistors of a selected one of the memory blocks when an erase count of the selected memory block reaches a critical value, and
the controller is configured to increase the critical value by a randomly generated value when the read operation is performed on the at least some of the at least one selection transistors of the selected memory block.

16. A storage device comprising:
a nonvolatile memory device including memory blocks; and
a controller configured to control the nonvolatile memory device, wherein:
each of the memory blocks includes a plurality of cell strings each including selection transistors and a plurality of memory cells stacked on a substrate in a direction perpendicular to the substrate,
the controller monitors respective threshold voltages of at least some of the selection transistors of a selected one of the memory blocks, and carries out a recovery operation on the selection transistors of the selected memory block according to a result of the monitoring of the threshold voltages, and
the selection transistors of each of the cell strings include a ground selection transistor provided between the memory cells and the substrate and a string selection transistor stacked on the memory cells.

17. The storage device of claim 16, wherein the monitoring of the respective threshold voltages is carried out selectively when at least one operating parameter of the selected one of the memory blocks exceeds a reference value.

18. The storage device of claim 17, wherein the at least one operating parameter includes an erase count of the selected one of the memory blocks.

19. The storage device of claim 16, wherein the monitoring of the respective threshold voltages includes performing a read operation on the some of the selection transistors of the selected one of the memory blocks.

20. The storage device of claim 19, wherein:
the recovery operation includes programming of the selection transistors based on a read result of the read operation of the some of the selection transistors of the selected one of the memory blocks, and
the controller checks whether threshold voltages of the selection transistors are in a voltage range after the recovery operation.

* * * * *